United States Patent
Ishibashi et al.

(10) Patent No.: US 6,319,853 B1
(45) Date of Patent: Nov. 20, 2001

(54) METHOD OF MANUFACTURING A SEMICONDUCTOR DEVICE USING A MINUTE RESIST PATTERN, AND A SEMICONDUCTOR DEVICE MANUFACTURED THEREBY

(75) Inventors: Takeo Ishibashi; Toshiyuki Toyoshima, both of Tokyo; Keiichi Katayama, Hyogo; Naoki Yasuda, Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/537,671

(22) Filed: Mar. 29, 2000

Related U.S. Application Data

(62) Division of application No. 09/115,517, filed on Jul. 15, 1998, now abandoned.

(30) Foreign Application Priority Data

Jan. 9, 1998 (JP) .................................................. 10-003205

(51) Int. Cl.$^7$ ....................... H01L 21/31; H01L 21/3105; H01L 21/312; H01L 21/47; G03C 5/00
(52) U.S. Cl. ........................ 438/780; 438/781; 430/312; 430/313; 430/325; 430/330
(58) Field of Search ................................ 438/789, 790, 438/502, 503, 509, 780, 781, 950

(56) References Cited

U.S. PATENT DOCUMENTS

| | | |
|---|---|---|
| 4,501,806 | 2/1985 | Watanabe et al. . |
| 5,324,550 | 6/1994 | Yamaguchi et al. . |
| 5,342,727 | 8/1994 | Vicari et al. . |
| 5,470,616 * | 11/1995 | Uenishi et al. ....................... 427/515 |
| 5,545,512 | 8/1996 | Nakato . |
| 5,554,466 * | 9/1996 | Matsushima et al. ............... 430/321 |
| 5,707,783 | 1/1998 | Stauffer et al. . |
| 5,858,620 * | 1/1999 | Ishibashi et al. ..................... 430/312 |
| 5,879,863 * | 3/1999 | Azuma et al. ........................ 430/322 |

FOREIGN PATENT DOCUMENTS

| | | |
|---|---|---|
| 5-166717 | 7/1993 | (JP) . |
| 5-241348 | 9/1993 | (JP) . |
| 0537616 | 9/1994 | (JP) . |
| 6-250379 | 9/1994 | (JP) . |
| 7-104472 | 4/1995 | (JP) . |
| 7-134422 | 5/1995 | (JP) . |

OTHER PUBLICATIONS

"Electron–Beam, X–Ray, and Ion–Beam Technology: Submicrometer Lithographies VII", Proceedings of SPIE—the International Society for Optical Engineering, vol. 923, 1988, pp. 158–171.

"Deep UV ANR Photoresists for 248 nm Excimer Laser Photolithography", Proceedings of SPIE—The International Society for Optical Engineering, vol. 1086, 1989, pp. 34–47.

\* cited by examiner

*Primary Examiner*—Mary Wilczewski
(74) *Attorney, Agent, or Firm*—McDermott, Will & Emery

(57) ABSTRACT

There is described a method of producing a pure resist pattern having superior topography smaller than the limit of wavelength of exposure light. A first resist pattern containing material capable of producing an acid on exposure to light is coated with a second resist containing material which causes a crosslinking reaction in the presence of an acid. An acid is produced in the resist pattern by exposing the pattern to light, thus forming a crosslinked layer along the boundary surface between the first resist pattern and the second resist. As a result, a second resist pattern which is greater than the first resist pattern is formed. Minute pure resist patterns are produced through two-step processing: that is, by removing the second resist from the substrate through use of a liquid prepared by dissolving an organic solvent into water and by rinsing the substrate with water. The diameter of holes formed in the resist or the interval between isolated patterns can be reduced.

20 Claims, 16 Drawing Sheets

POLYVINYL ACETAL

POLYACRYLIC ACID

POLYVINYLPYRROLIDONE

POLYVINYL ALCOHOL

POLYVINYLAMINE

POLYALLYLAMINE

STYRENE-MALEIC ACID COPOLYMER

POLY-N-VINYLFORMAMIDE

POLYETHYLENEIMIDE

POLYETHYLENE OXIDE

OXAZOLINE-CONTAINING WATER-SOLUBLE RESIN

RESIST PATTERN

RESIST PATTERN

RESIST PATTERN

FIG. 13 (a) FIG. 13 (b) FIG. 13 (c)
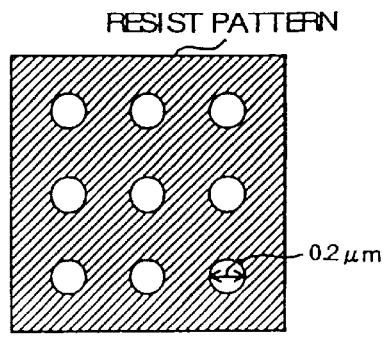
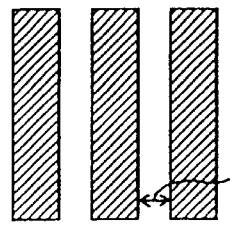
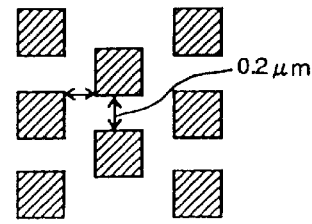
FIG. 14 (a) FIG. 14 (b) FIG. 14 (c)
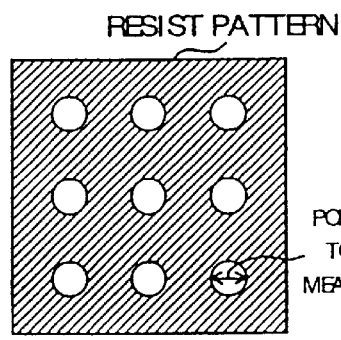
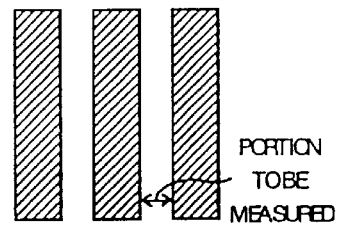
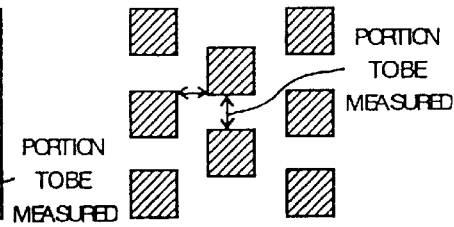
FIG. 15
| MIXING RATIO (wt) | | HOLE SIZE ($\mu m$) |
|---|---|---|
| POLYVINYL ACETAL | POLYVINYL ALCOHOL | |
| 0 | 0 | 0.38 |
| 0 | 0 | 0.37 |
| 5 | 1.76 | 0.36 |
| 5 | 3.68 | 0.34 |
| 5 | 1 | 0.28 |

FIG. 16
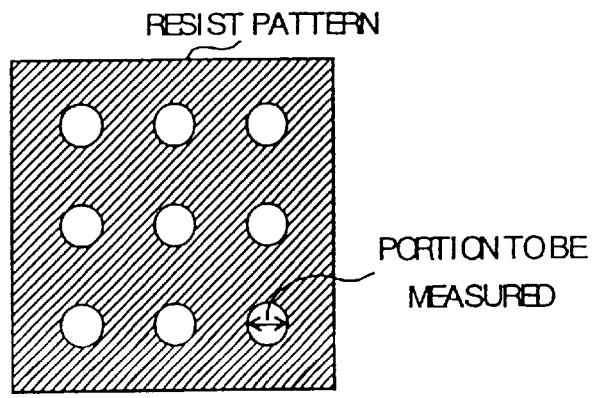
FIG. 17
| SAMPLE | HOLE SIZE ($\mu m$) |
|---|---|
| COMPARATIVE PRODUCT | 0.36 |
| ENTIRE SURFACE NOT EXPOSED TO LIGHT | 0.25 |
| ENTIRE SURFACE EXPOSED TO LIGHT | 0.22 |
FIG. 18(a)   FIG. 18(b)   FIG. 18(c)
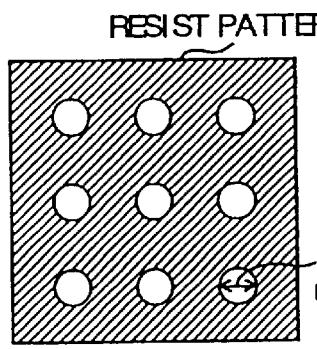 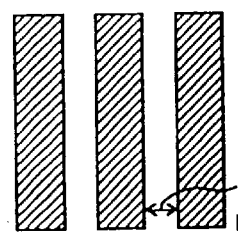 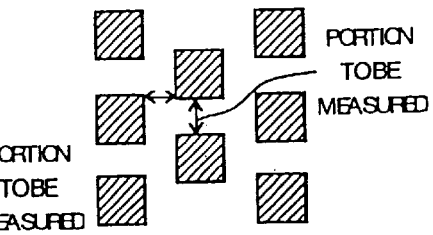

| MB TEMPERATURE (°C) | | HOLE SIZE (μm) | LINE SPACE (μm) | ISLAND SPACE (μm) |
|---|---|---|---|---|
| | EXMPLE 2 | 0.36 | 0.40 | 0.40 |
| 105 | | 0.26 | 0.329 | 0.325 |
| 115 | | 0.24 | 0.321 | 0.319 |
| 125 | | 0.22 | 0.312 | 0.308 |

| | MB TEMPERATURE(°C) | |
|---|---|---|
| CONCENTRATION OF METHOXYETHYLENE -UREA(wt%) | 100 | 110 |
| EXMPLE 2 | 0.41 | 0.41 |
| 0 | 0.40 | 0.39 |
| 11 | 0.38 | 0.38 |
| 20 | 0.34 | 0.31 |
| 27 | 0.30 | 0.28 |

FIG. 22

| WATER-SOLUBLE MATERIAL | HOLE SIZE (μm) |
|---|---|
| EXMPLE 3 | 0.24 |
| POLYVINYL ACETAL RESIN ALONE | 0.22 |
| POLYVINYL ACETAL RESIN + N-METHOXYMETHYL-DIMETHOXYMETHYLENEUREA | 0.12 |
| POLYVINYL ACETAL RESIN + N-METHOXYMETHYL-HYDROXYMETHOXYETHYLENEUREA | 0.13 |
| POLYVINYL ACETAL RESIN + N-METHOXYMETHYL-UREA | 0.18 |

FIG. 23

| AGENT FOR UPPER LAYER | RESIST PATTERN SIZE (INITIAL VALUE, μm) | PATTERN SIZE AFTER TREATMENT (μm) | |
|---|---|---|---|
| | | MIXING BAKE TEMPERATURE | |
| | | 105°C | 115°C |
| POLYVINYL ACETAL RESIN + METHOXYETHYLENEUREA (10wt%) | 0.24 | 0.20 | 0.16 |
| POLYVINYL ACETAL RESIN + METHOXYETHYLENEUREA (20wt%) | 0.24 | 0.16 | 0.13 |

FIG. 24

| BAKING TEMPERATURE (°C) | HOLE SIZE (μm) | |
|---|---|---|
| | POLYVINYL ALCOHOL | POLYVINYL ALCOHOL (N-METHOXYMETHYL) DIMETHOXYETHYLENEUREA |
| EXMPLE 3 | 0.24 | 0.24 |
| 95 | 0.24 | 0.18 |
| 105 (FIG. 21) | 0.24 | 0.14 |
| 115 | 0.24 | 0.12 |

FIG. 25

| SECOND RESIST | CLEANING METHOD OF SECOND RESIST | KLA PATTERN DEFECT INSPECTION | |
|---|---|---|---|
| | | DEFECT NUMBER | RESIDUE NUMBER |
| POLYVINYL ALCOHOL | PURE WATER / 60 SECOND CLEANING | 400 | 300 |
| | PURE WATER / 180 SECOND CLEANING | 220 | 110 |
| | PURE WATER / 300 SECOND CLEANING | 200 | 110 |
| | PURE WATER + ISOPROPANOL / 10 SECOND CLEANING + PURE WATER / 50 SECOND CLEANING | 0 | 0 |
| POLYVINYL ALCOHOL (N-METHOXYMETHYL) DIMETHOXYETHYLENEUREA | PURE WATER / 60 SECOND CLEANING | 5 | 1 |
| | PURE WATER + ISOPROPANOL / 10 SECOND CLEANING + PURE WATER / 50 SECOND CLEANING | 0 | 0 |

FIG. 26

| AGENT FOR UPPER LAYER | RESIST PATTERN SIZE (INITIAL VALUE, $\mu m$) | PATTERN SIZE AFTER TREATMENT ($\mu m$) | |
|---|---|---|---|
| | | MIXING BAKE TEMPERATURE | |
| | | 105°C | 115°C |
| POLYVINYL ACETAL RESIN + METHOXYETHYLENEUREA (10wt%) | 0.20 | 0.18 | 0.14 |
| POLYVINYL ACETAL RESIN + METHOXYETHYLENEUREA (20wt%) | 0.20 | 0.14 | 0.11 |
| POLYVINYL ALCOHOL RESIN + METHOXYETHYLENEUREA (10wt%) | 0.20 | 0.18 | 0.16 |

FIG. 27

| | RESIST PATTERN SIZE | PATTERN SIZE AFTER TREATMENT |
|---|---|---|
| EXMPLE 2 | 0.36 | — |
| EXMPLE 20 | PORTION IRRADIATED WITH EB | 0.36 |
| | PORTION NOT IRRADIATED WITH EB | 0.24 |

METHOD OF MANUFACTURING A SEMICONDUCTOR DEVICE USING A MINUTE RESIST PATTERN, AND A SEMICONDUCTOR DEVICE MANUFACTURED THEREBY

This application is a Divisional of application Ser. No. 09/115,517 filed Jul. 15, 1998, now abandoned.

BACKGROUND OF THE INVENTION

1. Field of the Invention

The present invention relates to a method of manufacturing a semiconductor device wherein minutely isolated resist patterns are formed and the side walls thereof are roughened. More concretely, the present invention relates to a method of forming minutely isolated resist patterns in which a space between patterns and the size of a hole are reduced. The present invention further relates to a method of roughening the side walls of the minutely isolated resist patterns after etching.

2. Background Art

The width of an interconnection runner and the space between interconnection runners required to manufacture a semiconductor device are greatly reduced as the degree of integration of a semiconductor device is increased. Minute patterns are usually formed by forming a resist pattern through use of photolithography and by etching various thin films beneath the resist pattern while using the resist pattern as a mask.

For this reason, photolithography becomes very important in forming a minute pattern. Photolithography comprises a resist coating process, a mask alignment process, an exposure process, and a development process. There is a restriction on the wavelength of light used for exposure, imposing a limitation on miniaturization of the pattern.

Methods described in Japanese Patent Application Laid-open Nos. 6-250379 and 7-134422 have already been proposed as methods of forming minute resist patterns smaller than the limit of wavelength of light for exposure purposes used by the existing photolithography. The methods utilize counter diffusion of resin components contained in first and second resists. Under these methods, the second resist is made of a material which is soluble in an organic solvent capable of dissolving the first resist, resulting in the first resist patterns being deformed.

Under a method used for removing the second resist, the second resist is removed and dissolved through use of a developer capable of generating an acid and dissolving the second resist upon exposure to light [e.g., TMAH (tetra-methyl-ammonium hydroxide)]. When the second resist is exposed to light, the first resist patterns beneath the second resist are also exposed to light and sometimes becomes solubilized. The thus-solubilized first resist patterns can be dissolved in a solution capable of dissolving the second resist. Therefore, there is a high risk of the first resist patterns being dissolved at the time of dissolving and removing the second resist, resulting in a small margin of error in the manufacturing process.

In a case where polyvinyl alcohol disclosed in Japanese Patent Application Laid-open No. 6-250379 is used as a second resist, several problems arise such as a small effect of the second resist or the poor topography of resist patterns produced after treatment. Further, since the second resist is developed through use of only water, the resist is not sufficiently rinsed, thus resulting in development residues, such as specks, being apt to arise in the pattern. Such development residues will cause defects to appear in resist patterns during a subsequent etching process.

As mentioned previously, it has been very difficult to form minute resist patterns smaller than the limit of wavelength of light for exposure purposes used for the existing photolithography, using the existing photolithography.

Although another technique has also been proposed which enables formation of resist patterns smaller than the limit of wavelength of light for exposure purposes, the technique suffers several problems, and hence it is difficult to apply the technique to actual manufacture of a semiconductor device.

SUMMARY OF THE INVENTION

The object of the present invention is to provide a technique of manufacturing minutely isolated resist patterns which enables formation of a minutely isolated or holed pattern smaller than the limit of wavelength of light for exposure purposes.

Another object of the present invention is to provide a method of forming a considerably clean pattern which is free from residues such as specks and which has superior geometry.

Still another object of the present invention is to provide a semiconductor device manufactured through use of the foregoing technique of manufacturing minutely-isolated resist patterns.

According to one aspect of the present invention, in a method of manufacturing a semiconductor device, a first resist pattern is formed which is capable of supplying an acid on a semiconductor substrate by growing a first resist and by forming a pattern on the first resist. A second resist is formed on the first resist pattern, and the second resist is incapable of dissolving the first resist pattern and capable of causing a crosslinking reaction in the presence of an acid. A crosslinked film is formed along the boundary surface between the first resist pattern and the second resist adjoining the first resist pattern by means of the acid supplied from the first resist pattern. A second resist pattern is formed through multi-step processing, wherein non-crosslinked portions of the second resist are developed through use of a solution of high solubility incapable of dissolving the first resist patterns but capable of dissolving the second resist and wherein the substrate is rinsed with a solution of low solubility. Finally, the semiconductor substrate is etched using the second resist patterns as masks.

In another aspect of the present invention, in the semiconductor device manufacturing method, the solution of high solubility is preferably a mixed solution formed by mixing water with alcohol or a water-soluble organic solvent to such an extent as not to dissolve the first resist, and the solution of low solubility is water.

In another aspect, the solution of high solubility contains a surfactant.

In another aspect, the first resist produces an acid upon exposure to light or when subjected to a heat treatment.

In another aspect, the first resist diffuses an acid included therein when subjected to a heat treatment to cause crosslinking reaction at an interface with said second resist.

In another aspect, the first resist produces an acid when exposed to light and when subjected to a heat treatment.

In another aspect, the first resist contains an acid.

In another aspect, the surface of the first resist pattern is processed through use of an acidic liquid or an acidic gas.

In another aspect, the crosslinked film is formed along the surface of a predetermined area of the first resist pattern by selectively exposing the predetermined area to light and by heating the thus-exposed area.

In another aspect, the crosslinked film is formed along the surface of a predetermined area of the first resist pattern by selectively exposing the predetermined area to an electron beam.

In another aspect, the first resist is formed from a mixture composed of novolac resin and a naphthoquinonediazide-based photosensitive agent.

In another aspect, the first resist is a chemically amplified resist which uses a mechanism of producing an acid when the resist is exposed to UV-rays, an electron beam, or X-rays.

In another aspect, the second resist is selected from a group consisting of water-soluble resin, water-soluble resin which causes a crosslinking reaction in the presence of an acid, a water-soluble crosslinking agent, and mixtures thereof.

In another aspect, the water-soluble resin is selected from the group consisting of a polyacrylic acid, polyvinyl acetal, polyvinylpyrrolidone, polyvinyl alcohol, polyethyleneimine, sytrene-maleic anhydride copolymer, polyvinylamine, polyallylamine, oxazoline group-containing water-soluble resins, water-soluble urethane, water-soluble phenol, water-soluble epoxy, water-soluble melamine resins, water-soluble urea resins, alkyd resins, sulfonamide, one type of salt thereof, and a mixture of two or more types of thereof.

In another aspect, the water-soluble crosslinking agent is one type of material or two or more types of materials selected from the group consisting of melamine-based crosslinking agents such as melamine derivatives or methylolmelamine derivatives; urea-based crosslinking agents such as urea derivatives, methylol urea derivatives, ethylene urea carboxylates, or methylol-ethylene-urea derivatives; and amino-based crosslinking agents such as benzoguanamine, glycoluril, isocyanates.

In another aspect, the second resist is polyvinyl acetal resin, and the amount of the second resist reacting with the first resist pattern is controlled by controlling the extent of acetalization of the polyvinyl acetal resin.

In another aspect, the second resist is a mixture of a water-soluble resin and a water-soluble crosslinking agent, and the amount of the second resist reacting with the first resist patterns is controlled by controlling the amount of the proportion of the water-soluble crosslinking agent.

In another aspect, a solvent for the second resist is water or a mixed solvent containing water, alcohol, and N-methylpirrolidone.

In another aspect, a semiconductor device is manufactured by either of the semiconductor device manufacturing methods as defined above.

Other and further objects, features and advantages of the invention will appear more fully from the following description.

BRIEF DESCRIPTION OF THE DRAWINGS

FIGS. 13A to 13C are plan views showing the first resist patterns formed in Example 4;

FIGS. 14A to 14C are plan views showing the second resist patterns formed in Example 13;

FIG. 15 is a table showing the results of measurement of the resist patterns formed in Example 13;

FIG. 16 is a plan view showing the second resist patterns formed in Example 14;

FIG. 17 is a table showing the results of measurement of the resist patterns formed in Example 14;

FIGS. 18A to 18C are plan views showing the second resist patterns formed in Example 15;

FIG. 22 is a table showing the results of measurement of the second resist patterns formed in Example 17;

FIG. 23 is a table showing the results of measurement of the second resist patterns formed in Example 18;

FIG. 24 is a table showing the results of measurement of the second resist patterns formed in Example 19;

FIG. 25 is a table showing the results of measurement of the second resist patterns formed in Example 20;

FIG. 26 is a table showing the results of measurement of the second resist patterns formed in Example 21; and FIG. 27 is a table showing the results of measurement of the second resist patterns formed in Example 22.

BEST MODES FOR CARRYING OUT THE INVENTION

Figure 1:
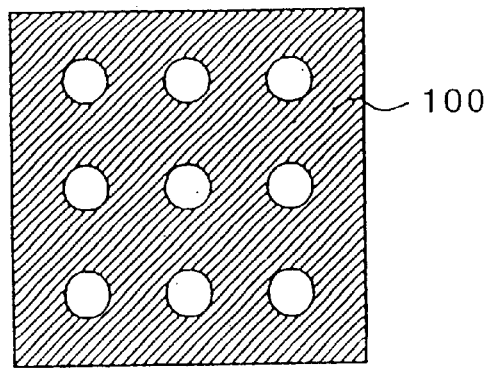
FIGS. 1A to 1C are views showing mask patterns used for manufacturing resist patterns under a method according to a first embodiment of the present invention.
Figure 1:
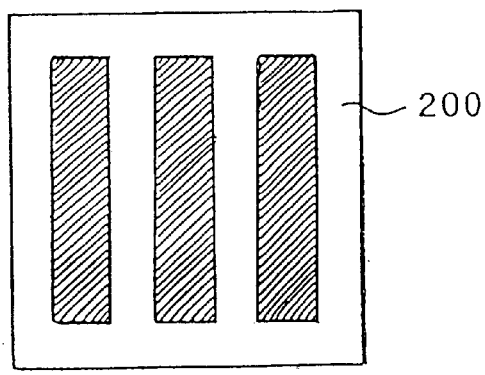
Figure 1:
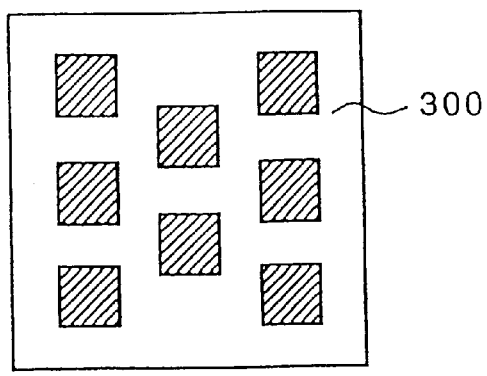

Various embodiments and examples of the present invention will be described with reference to the drawings, in which same reference numerals designate same or corresponding elements.

First Embodiment

FIGS. 1A to 1C are schematic representations showing examples of mask patterns used for forming minutely-isolated resist patterns according to the present invention. FIG. 1A shows a mask pattern 100 having minute holes formed therein; FIG. 1B shows a mask pattern 200 having slits which are spaced at minute pitches apart from one another; and FIG. 1C shows a pattern 300 comprising isolated islands. FIGS. 2A to 2E and FIGS. 3A to 3F are flowcharts for explaining the processes of manufacture of minutely isolated resist patterns according to a first embodiment of the present invention.

First, referring to FIGS. 1A to 1C and FIGS. 2A to 2E, an explanation will be given of a method of manufacturing minutely-separated resist patterns according to the first embodiment, as well as of a method by which a semiconductor device is formed through use of the thus-formed resist patterns.

Figure 2:
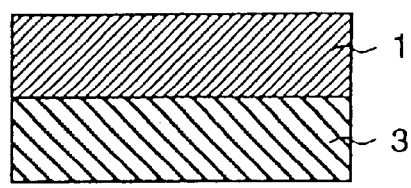
FIGS. 2A to 2E are flowcarts for explaining processes of manufacture of resist patterns under the method according to the first embodiment.
Figure 2:
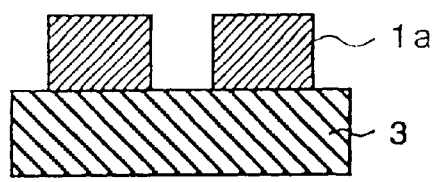
Figure 2:
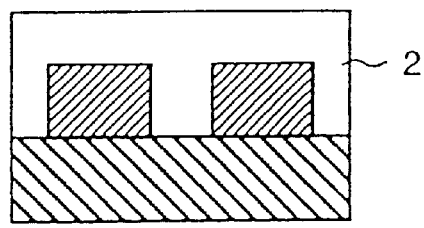
Figure 2:
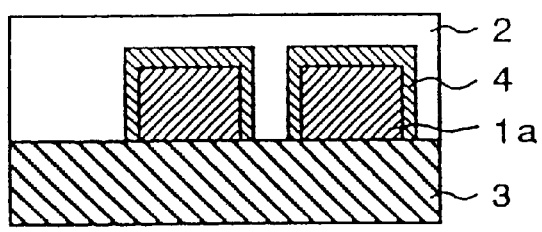
Figure 2:
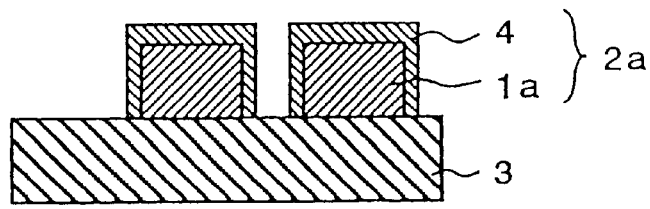

As shown in FIG. 2A, a first resist 1 which produces an acid from inside when subjected to an appropriate heat treatment is applied to a semiconductor substrate (e.g., a semiconductor wafer) 3 (to the thickness, e.g., ranging from 0.7 to 1.0 $\mu$m or thereabouts).

The first resist 1 is applied to the semiconductor substrate 3 by spin coating, and the substrate is subjected to a pre-baking treatment (e.g., a heat treatment at 70 to 110° C. for one minute or thereabouts), thus evaporating a solvent contained in the first resist 1.

Next, the substrate is exposed to light corresponding to the sensitizing wavelength of the first resist 1, e.g., a g-line, an i-line, Deep-UV rays, a KrF excimer laser beam, an ArF excimer laser beam, an electron beam, X-rays, or the like, through use of a mask having any one of patterns such as those shown in FIGS. 1A through 1C, thereby forming first resist patterns 1a.

The first resist 1 used in the first embodiment is not limited to any specific type of resist. A resist of any type may be used, so long as it uses a mechanism to produce an acidic component in the resist when the resist is subjected to a heat treatment or exposure. For example, a positive or negative resist maybe used, so long as it produces an acid when exposed to, e.g., a KrF excimer laser beam, an ArF excimer laser beam, an electron beam, X-rays, or the like.

For example, the first resist 1 may be a positive resist made of novolac resin or a naphthoquinonediazide-based photosensitive agent.

A chemically amplified resist—which uses a mechanism to produce an acid when the resist is exposed to light—may also be used as the first resist 1. The first resist 1 is not limited to any specific type of resist, so long as the resist utilizes a reaction system for producing an acid upon exposure.

After the first resist 1 has been exposed to light, the substrate is subjected to a post-exposure baking (PEB) treatment (at a temperature of, e.g., 50 to 130° C.), as required, thus improving the resolution of the photoresist. Subsequently, the first resist 1 is developed, using a 0.05 to 3.0 wt. % alkaline aqueous solution of TMAH (tetra methyl ammonium hydroxide). FIG. 2B shows the thus-formed first resist patterns 1a.

In some cases, the substrate is subjected to a post-development baking treatment (at a temperature of 60 to 120° C. for about 60 sec.) after development, as required. Since the heat treatment affects a crosslinking reaction afterward, it is desirable to set the temperature of the baking treatment to a suitable temperature in accordance with material used as the first or second resist.

Aside from the use of the first resist 1 that produces an acid, the resist patterns are formed in the same manner as those are formed under a common process.

As shown in FIG. 2C, the semiconductor substrate 3 is coated with a second resist 2 which contains a crosslinkable compound capable of crosslinkage in the presence of an acid and which is dissolved in water incapable of dissolving the first resist 1 shown in any one of FIGS. 1A to 1C or in a mixed solvent composed of water and a water-soluble solvent.

A method of applying the second resist 2 is not limited to a specific method, so long as the method enables uniform coating of the first resist patterns 1a. The first resist patterns 1a may be coated with the second resist 2 by spraying or by immersing (or dipping) the substrate into a second resist solution.

After application of the second resist 2, the substrate is pre-baked (e.g., at 85° C. for about 60 sec.), as needed, to thereby form a layer of the second resist 2.

As shown in FIG. 2D, the first resist patterns 1a formed on the semiconductor substrate 3 and the second resist 2 formed over the first resist patterns la are subjected to a heat treatment (e.g., a mixing-and-baking treatment which will be hereinafter abbreviated to "MB" when necessary and which is performed at a temperature of, e.g., 85 to 150° C.). As a result, diffusion of an acid from the inside of the first resist patterns 1a to the second resist 2 is accelerated, thus inducing a crosslinking reaction along a boundary surface between the second resist 2 and the first resist patterns 1a. In this case, the MB treatment is performed at a temperature of, e.g., 85 to 150° C. for 60 to 120 seconds. Optimum conditions may be set with reference to the type of material used as a resist or the required thickness of a reaction layer.

To begin with, as shown in FIG. 2E, the first resist patterns 1a are rinsed with a mixed solution comprising water incapable of dissolving the first resist patterns 1a and a water-soluble organic solvent (e.g., propanol) . The first resist patterns 1a are then rinsed with water and dried, thus removing non-crosslinked portions of the second resist 2. Through the foregoing processes, it is possible to produce a resist pattern having holes of smaller inner diameter, resist patterns spaced at smaller pitches apart from one another, or a resist pattern which comprises isolated islands having an increased area.

The concentration of propanol in water may be set within a range of about 1 to 30 wt. %; that is, a range in which propanol does not dissolve the first resist but sufficiently dissolves non-crosslinked portions of the second resist. The concentration of another water-soluble organic solvent to be mixed with water is also similarly determined.

With reference to FIGS. 2A to 2E, the explanation has described the method of forming minute resist patterns under which after the layer of second resist 2 has been formed over the first resist patterns 1a, an acid is diffused to the second resist 2 from the inside of the first resist patterns 1a through a suitable heat treatment.

An explanation will now be given of a method in which an acid is produced by exposure substituted for or prior to a heat treatment.

Figure 3:
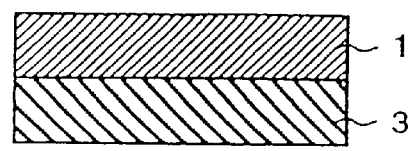
FIGS. 3A to 3F are flowcharts for explaining processes of manufacture of resist patterns under the method according to the first embodiment.
Figure 3:
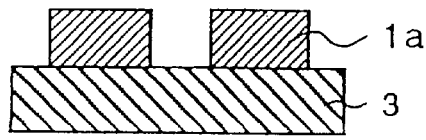
Figure 3:
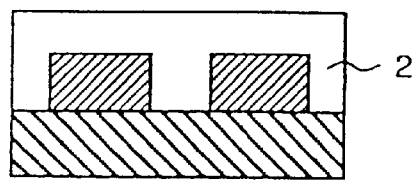
Figure 3:
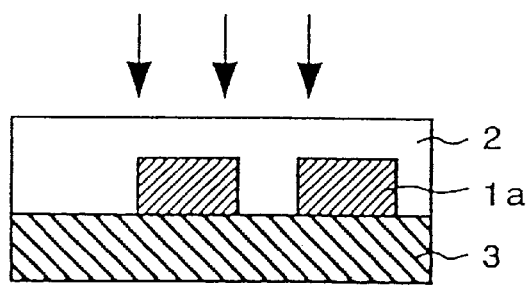
Figure 3:
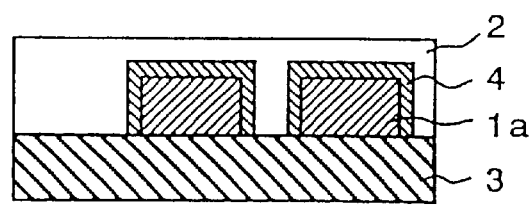
Figure 3:
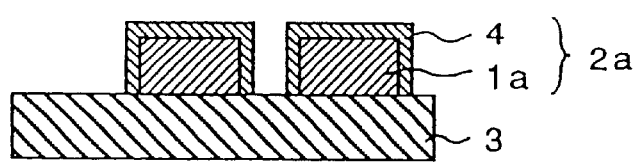

FIGS. 3A to 3F are flowcharts for explaining the method of manufacturing minutely isolated resist patterns. FIGS. 3A to 3C show the same processes as those shown in FIGS. 2A to 2C, and hence their explanations will be omitted here. In such a case, a chemically amplified resist which uses a mechanism to produce an acid when the resist is exposed to light can also be used as the first resist 1. When the chemically amplified resist is exposed to light, an electron beam, or X-rays, an acid catalyst is generated, which in turn causes an amplifying response.

After the layer of second resist 2 shown in FIG. 3C has been formed, the entire surface of the semiconductor substrate is again exposed to a g-line or an i-line of a Hg lamp in a manner as shown in FIG. 3C, thus generating an acid in the first resist patterns 1a. As a result, as shown in FIG. 3E, a crosslinked layer 4 is formed along the boundary surface between the first resist pattern 1a and the second resist 2 adjoining it.

With reference to the sensitizing wavelength of the first resist, a Hg lamp, a KrF excimer laser beam, or an ArF excimer laser beam may be used as the light source at this time. The light source is not limited to a specific type of light, so long as an acid can be generated in the first resist patterns 1a when the substrate is exposed to light. The semiconductor substrate may be exposed to light through use of a light source and an exposure value, both of which correspond to the sensitizing wavelength of the first resist.

In the example shown in FIGS. 3A to 3F, the semiconductor substrate 3 is exposed to light after having been coated with the second resist 2, thus generating an acid in the first resist patterns 1a . Since the first resist patterns 1a are exposed to light while being coated with the second resist 2, the amount of acid generated in the first resist patterns 1a can be accurately controlled over a wide range by controlling the exposure value, enabling accurate controlling of thickness of the crosslinked layer 4.

The semiconductor substrate 3 is subjected to a heat treatment [e.g., a mixing-and-baking (MB) treatment at a temperature of 60 to 130° C.], as required, thereby accelerating diffusion of an acid into the second resist 2 from the first resist patterns 1a. As a result, a crosslinking reaction arising in the boundary surface between the second resist 2 and the first resist patterns 1a is accelerated. The MB treatment is performed at, e.g., a temperature of 60 to 130° C. for 60 to 120 sec. Optimum conditions may be set with reference to the type of material used for the resist and the required thickness of the crosslinked layer 4.

As a result of the mixing-and-baking treatment, the crosslinked layer 4—in which a crosslinking reaction has occurred—is formed in the second resist 2 so as to cover the first resist patterns 1a.

The process shown in FIG. 3F is the same as that shown in FIG. 2E. Through the foregoing processes, it is possible to produce a resist pattern having holes of smaller inner diameter, resist patterns spaced at smaller pitches apart from each other, or a resist pattern which comprises isolated islands having an increased area.

As is evident from the method described by reference to FIGS. 3A to 3F, the process of producing an acidic component in the first resist patterns la by exposing the semiconductor substrate to light is particularly suitable for a case where both the first resist 1 and the second resist 2 used by the method have a low degree of reactivity, where the required thickness of the crosslinked layer 4 is comparatively large, or where crosslinking reaction is made uniform.

Material used for the second resist 2 will now be described.

The second resist 2 may be a single crosslinkable water-soluble resin or a mixture of two or more types of crosslinkable water-soluble resins; a single water-soluble crosslinking agent or a mixture of two or more types of water-soluble crosslinking agents; or a mixture of a water-soluble resin composition and a crosslinking agent.

In a case where a mixture is used as material of the second resist 2, the composition of the material is not limited to a specific composition. An optimum composition may be determined with reference to the type of the first resist 1 to be used and preset reaction conditions.

Figure 4:
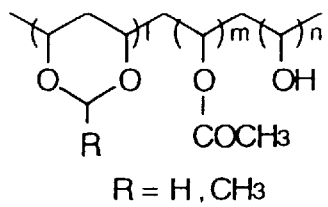
FIG. 4 shows chemical formulae for specific examples of water-soluble resin compositions used in the first embodiment.
Figure 4:
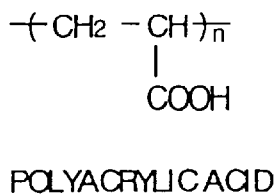
Figure 4:
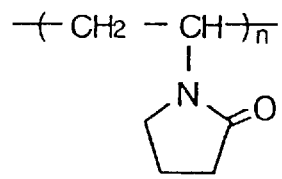
Figure 4:
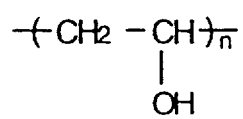
Figure 4:
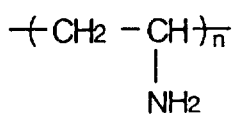
Figure 4:
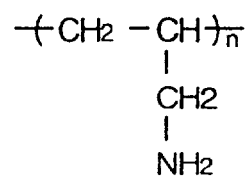
Figure 4:
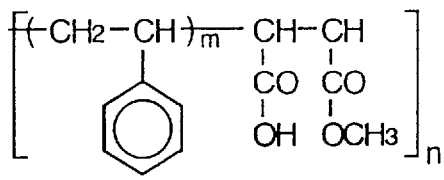
Figure 4:
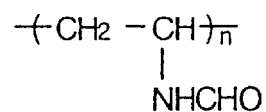
Figure 4:
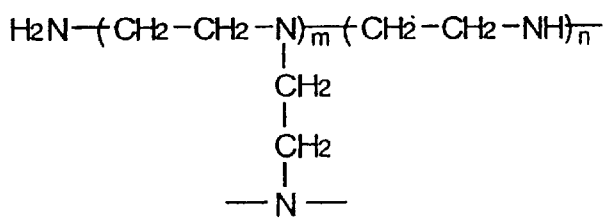
Figure 4:
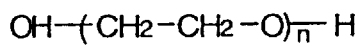
Figure 4:
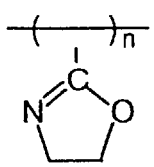

Examples of particularly desirable water-soluble resin compositions comprise compositions such as those shown in FIG. 4; that is, polyvinyl acetal resins, polyvinyl alcohol resins, polyacrylic acid resins, oxazoline group-containing resins, water-soluble urethane resins, polyallylamine resins, polyethyleneimine resins, polyviylamine resins, water-soluble phenolic resins, water-soluble epoxy resins, styrene-maleic acid copolymers, or the like. Another type of composition may also be used as the water-soluble resin composition, so long as the composition causes a crosslinking reaction in the presence of an acidic component. Even in the case of a composition which does not cause a crosslinking reaction or causes a crosslinking reaction to only a small extent, the composition is not limited to a specific type of composition, so long as the composition can be mixed with a water-soluble crosslinking agent. Further, such a composition may be used solely or in the form of a mixture.

The foregoing water-soluble composition may be solely used or in the form of a mixture comprising two or more types of compositions. According to the amount of water-soluble resin reacting with the first resist patterns underlying the second resist or to conditions under which the water-soluble resin reacts with the first resist patterns, the water-soluble resin can be controlled, as required. Further, with a view to improving the solubility of the water-soluble resin with respect to water, the water-soluble resin may be used in the form of a salt such as hydrochloride.

Figure 5:
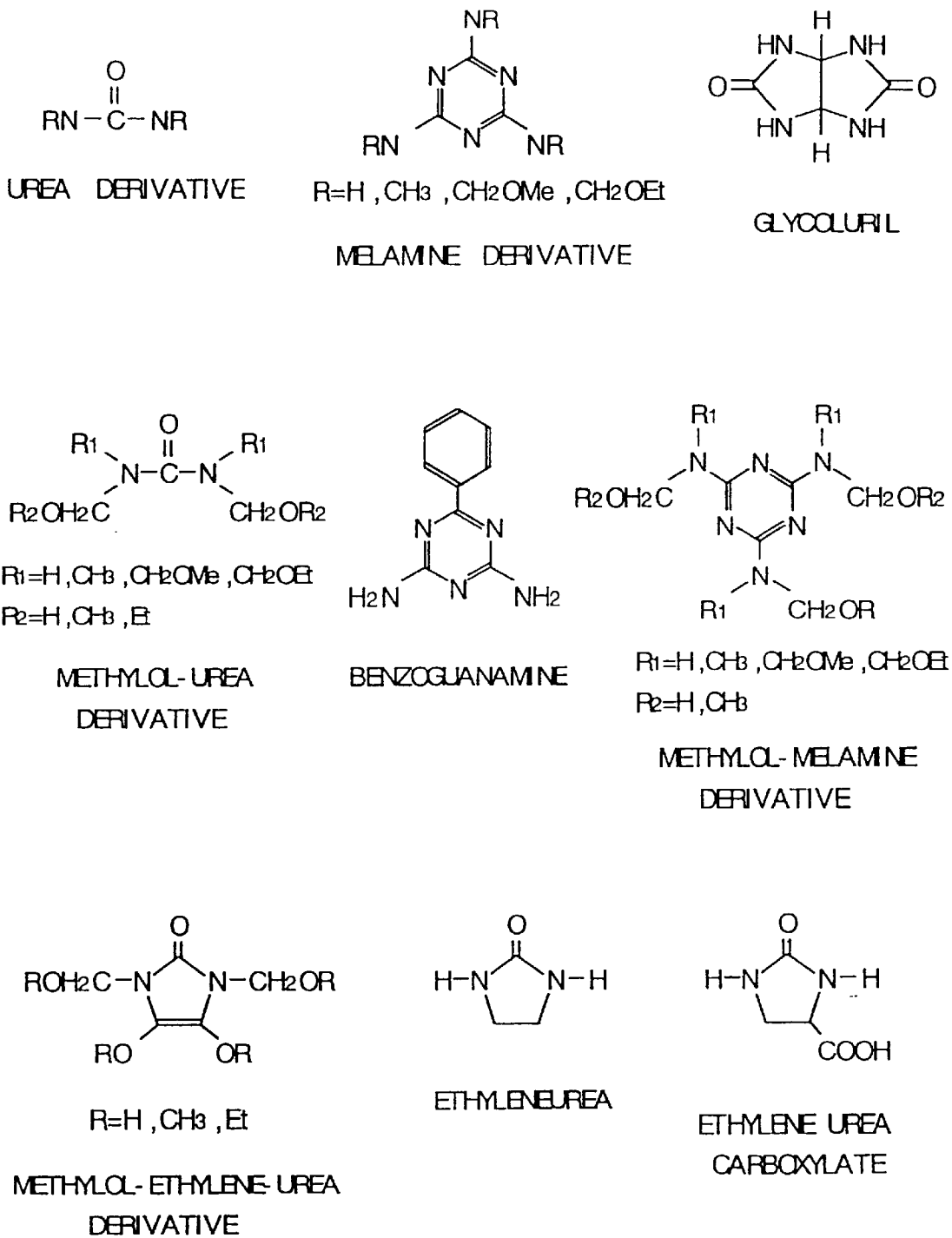
FIG. 5 shows chemical formulae for specific examples of water-soluble crosslinking agent compositions used in the first embodiment.

Next, specific examples of water-soluble crosslinking agents capable of being desirably used with the second resist 2 comprise agents such as those shown in FIG. 5; that is, melamine-based crosslinking agents such as melamine derivatives or methylol-melamine derivatives; urea-based crosslinking agents such as urea derivatives, methylol-urea derivatives, ethyleneurea, ethylene urea carboxylates, or methylol-ethylene-urea derivatives; or amino-based crosslinking agents such as isocyanates, benzoguanamine, glycoluril, or the like. The water-soluble crosslinking agent is not limited to a specific type of crosslinking agent, so long as the agent causes crosslinkage through use of an acid.

The single water-soluble resin or the mixture of water-soluble resins mentioned previously may be used as a specific water-soluble material of the second resist 2 while being mixed with the single water-soluble crosslinking agent or the mixture of water-soluble crosslinking agents mentioned previously.

More specifically, a polyvinyl acetal resin used as the water-soluble resin composition and metoxy-methylol-melamine or ethylene-urea used as the water-soluble crosslinking agent can be mixedly used as a water-soluble material of the second resist. In such a case, since the composition and the agent have high solubility with respect to each other, a mixed solution comprising the composition and the agent has superior storage stability.

Material used as the second resist is not limited to a specific type of material, so long as the material is water-soluble or soluble in water-soluble solvent incapable of dissolving the first resist patterns and causes a crosslinking reaction in the presence of an acidic component.

As mentioned previously, a crosslinking reaction can be induced solely be means of a heat treatment without the necessity for producing an acid by again exposing the first resist patterns 1a to light. In such a case, it is desirable to select a suitable material having high reactivity as the second resist 2, as well as to subject the thus-selected material to a suitable heat treatment (e.g., at a temperature of 85 to 150° C.).

More specifically, the second resist can be formed from a water-soluble composition comprising polyvinyl acetal resin and etyleneurea, a water-soluble composition comprising polyvinyl alcohol and ethyleneurea, a water-soluble combination comprising a mixture of these substances in suitable proportions, or the like.

The control of thickness of the crosslinked layer 4 formed over each of the first resist patterns 1$a$ is critical to controlling a crosslinking reaction between the first resist patterns 1$a$ and the second resist 2. It is desirable to optimize the control of the crosslinking reaction according to the reactivity between the first and second resists, the topography of the first resist patterns 1$a$, the required thickness of the crosslinked layer 4, or the like.

The crosslinking reaction between the first and second resists and (5) various conditions such as coating conditions.

Particularly, it is known that the reactivity between the first and second resists is affected by the composition of the material used as the first resist. For this reason, in a case where the present invention is actually applied to manufacture of a semiconductor device, it is desirable to optimize the composition of material used as the second resist, in consideration of the foregoing factors. Accordingly, the type or compositional ratio or water-soluble material used as the second resist are not limited to a specific type or ratio, but are optimized according to the type of material to be used and conditions for heat treatment.

A plasticizer such as ethylene glycol, glycerine, triethylene glycol, or the like may be added, as an additive, to the material used for the second resist. With a view to improving growth of the second resist, a water-soluble surfactant, e.g., Florade (manufactured by Sumitomo 3M Ltd.) or Nonipole (manufactured by Sanyo Chemical Industries Ltd.), may be added, as an additive, to the material used as the second resist.

A solvent used for the second resist will now be described. An aqueous solution containing water or a water-soluble organic solvent is used as a solvent for the second resist. The aqueous solution is required not to dissolve the first resist patterns but to sufficiently dissolve an aqueous material. The solvent is not limited to a specific type of solvent, so long as it meets the foregoing requirements.

For example, a solvent used for the second resist may be water (pure water), a mixture of water and an alcohol-based solvent such as IPA, a single water-soluble organic solvent such as N-methylpyrrolidone, or a mixed solution comprising water and the water-soluble organic solvent. A solvent to be mixed with water is not limited to a specific type of solvent, so long as it is water-soluble. For example, alcohol such as ethanol, methanol, or isopropyl alcohol; γ-butyrolactone; can be controlled in two ways; that is, by control of processing conditions, and by control of composition of the material used as the second resist.

Methods effective in controlling the process of a crosslinking reaction comprise :

(1) a method of controlling the amount of light to which the first resist patterns are exposed, and (2) a method of controlling the temperature at which a mixing-and-baking (MB) treatment is performed and the time required for the treatment.

Particularly, the thickness of a crosslinked layer can be controlled by control of the time which is required to heat the second resist to thereby cause a crosslinking reaction. This method enables a very high-degree of control of the crosslinking reaction.

Methods effective in controlling the composition of a material used as the second resist comprise (3) a method of controlling the amount of the second resist reacting with the first resist by mixing together two or more types of suitable water-soluble resins and by regulating a mixture ratio of the water-soluble resins, and (4) a method of controlling the amount of the second resist reacting with the first resist by mixing a water-soluble resin with a suitable water-soluble crosslinking agent and by regulating a mixture ratio of the water-soluble resin to the water-soluble crosslinking agent.

Determination of the control of the crosslinking reaction is not a straight forward matter and must be determined, in consideration of:

(1) the reactivity between material used for the second resist and material used for the first resist;

(2) the topography and thickness of the first resist pattern;

(3) the required thickness of the crosslinking agent;

(4) available exposure conditions or heating (or MB) conditions; acetone; or the like, may be used as the solvent. The solvent is mixed with the second resist to such an extent as not to dissolve the first resist patterns, in consideration of the solubility of the material used as the second resist.

Although the foregoing explanation has described the method of forming minute resist patterns over the entire surface of the semiconductor substrate 3, an explanation will now be given of a method of selectively forming minute resist patterns only in a desired region of the semiconductor substrate 3. FIGS. 6A to 6F are flowcharts showing manufacture of the semiconductor device using the foregoing method.

Figure 6:
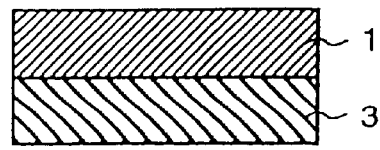
FIGS. 6A to 6F are flowcharts for explaining processes of manufacture of resist patterns under the method according to the first embodiment.
Figure 6:
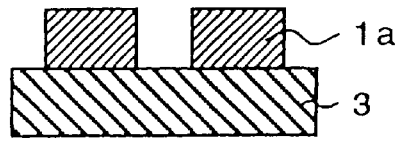
Figure 6:
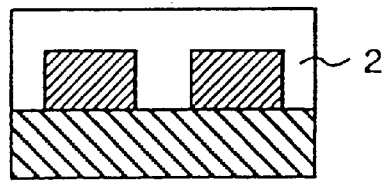
Figure 6:
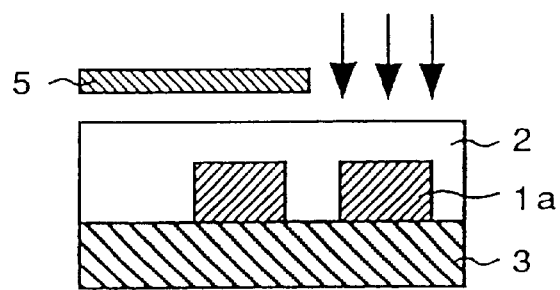
Figure 6:
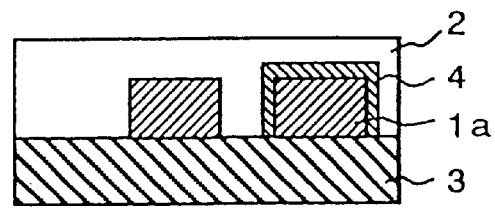
Figure 6:
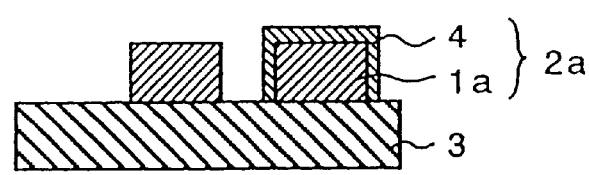

FIGS. 6A to 6C show the same processes as those shown in FIGS. 3A to 3C. After the second resist layer 2 has been formed as shown in FIG. 6C, part of the semiconductor substrate 3 is shielded with a light-shielding plate 5, and the thus-selected region of the semiconductor substrate is again exposed to a g-line or an i-line of the Hg lamp, thus producing an acid in the first resist patterns 1$a$. As shown in FIG. 6E, the thus-produced acid produces the crosslinked layer 4 in the exposed region of the semiconductor substrate along the boundary surface between the first resist pattern 1$a$ and the second resist 2 adjoining the first resist pattern.

A process shown in FIG. 6F following the step shown in FIG. 6E is the same as that shown in FIG. 3F, and hence its explanation will be omitted.

In this way, as shown in FIG. 6F, the crosslinked layer 4 can be formed over the first resist pattern 1$a$ in the selected region of the semiconductor substrate 3 while a crosslinked layer is prevented from being formed over the first resist pattern 1$a$ located in the other region of the semiconductor substrate.

Under the foregoing method, a distinction is drawn between an exposed region and an unexposed region by selectively exposing the semiconductor substrate 3 to light through use of a suitable mask, and a crosslinked area and a non-crosslinked area can be formed along the boundary surface between the second resist pattern 2$a$ and the first resist pattern 1$a$.

As a result, minute holes or spaces of different sizes can be formed on the same semiconductor substrate.

FIGS. 7A to 7F are flowcharts showing processes of a method by which minute resist patterns are selectively formed in a desired region of the semiconductor substrate 3.

Figure 7:
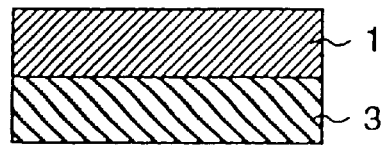
FIGS. 7A to 7F are flowcharts for explaining processes of manufacture of resist patterns under the method according to the first embodiment.
Figure 7:
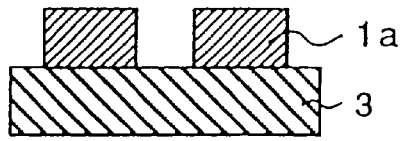
Figure 7:
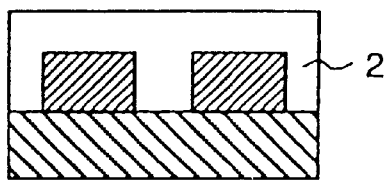
Figure 7:
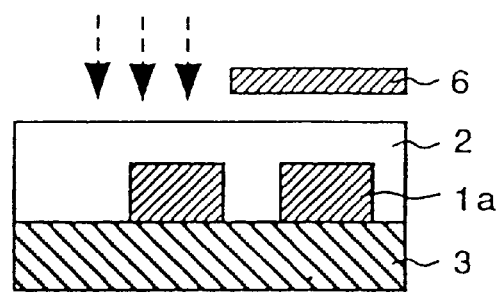
Figure 7:
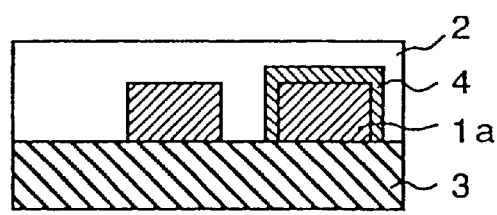
Figure 7:
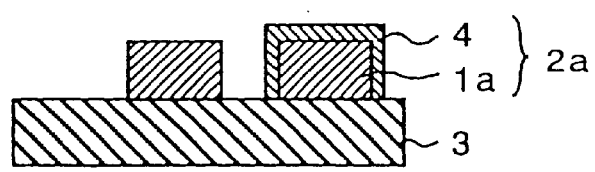

Processes shown in FIGS. 7A and 7B are the same as those shown as shown in FIG. 7B, a selected region of the semiconductor substrate 3 is shielded with an electron beam shielding plate 6 in a manner as shown in FIG. 7C, thus exposing the other region of the substrate to an electron beam.

The second resist 2 is formed in a process shown in FIG. 7D, and the substrate is subjected to a heat treatment in a process shown in FIG. 7E. As a result, a crosslinked layer is not formed in the region of the substrate exposed to an electron beam, whereas a crosslinked layer is formed in the region shielded from the electron beam.

A process shown in FIG. 7F following the process shown in FIG. 7E is the same as that shown in FIG. 3F, and hence its explanation will be omitted.

In this way, as shown in FIG. 7F, the crosslinked layer 4 can be formed over the first resist pattern 1a in the selected region of the semiconductor substrate 3 while a crosslinked layer is prevented from being formed over the first resist pattern 1a in the other region of the substrate. As a result, minute holes or spaces of different sizes can be formed on the same semiconductor substrate.

Although a detailed explanation has described the method of forming minutely isolated resist patterns on the semiconductor substrate 3, minutely isolated resist patterns according to the present invention are not limited to being formed on the semiconductor substrate 3. Depending on the process of manufacture of a semiconductor device, minutely isolated resist patterns may be formed over a dielectric layer such as a silicon oxide film or over a conductive layer such as a polysilicon film.

As mentioned previously, formation of minutely isolated resist patterns according to the present invention is not particularly limited by a film underlying the resist pattern. The present invention can be applied to any types of substrates, so long as the substrates permit formation of resist patterns, and minutely isolated resist patterns can be formed on a required substrate. All of these substrates will be hereinafter generically referred to as "semiconductor substrates."

Further, according to the present invention, while minutely isolated resist patterns formed in the manner as mentioned previously are used as masks, various thin films formed beneath the masks are etched to form fine spaces or holes in the thin films, thus forming a semiconductor device.

Further, according to the present invention, minutely isolated resist patterns (i.e., the second resist patterns 2a) are formed through formation of the crosslinked layer 4 over the first resist patterns 1a by appropriately setting a material for the second resist, the composition of the material, and a time required to heat the second resist in order to cause a crosslinking reaction (i.e., an MB time). The present invention has the effect of roughening the side walls of the patterns formed on the substrate after the semiconductor substrate has been etched through the minutely isolated resist patterns as masks.

Second Embodiment

FIGS. 8A to 8E are flowcharts for explaining a method of forming minutely isolated resist patterns according to a second embodiment of the present invention. The method of forming minutely isolated patterns according to a second embodiment and a method of manufacturing a semiconductor device using this pattern forming method, will be described by reference to FIGS. 1A–1C through FIGS. 8A–8E.

Figure 8:
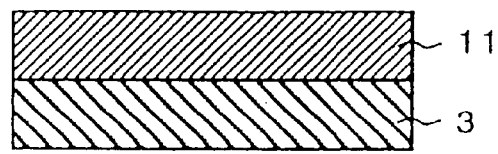
FIGS. 8A to 8E are flowcharts for explaining processes of manufacture of resist patterns under another method according to a second embodiment of the present invention.
Figure 8:
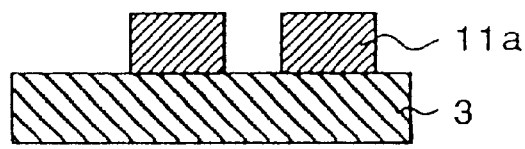
Figure 8:
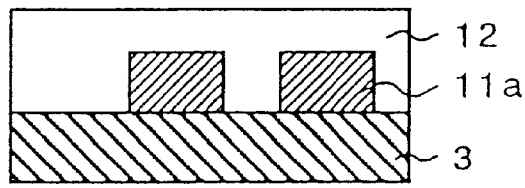
Figure 8:
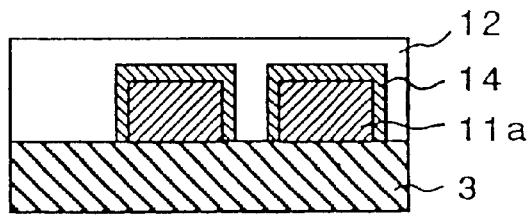
Figure 8:
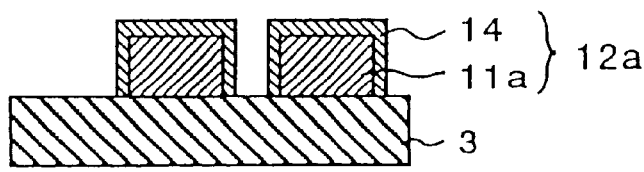

As shown in FIG. 8A, the semiconductor substrate 3 is coated with a first resist 11 including therein a small amount of acidic substance. After the first resist pattern 11 has been subjected to a pre-baking treatment (a heat treatment at a temperature of 70 to 100° C. for about one minute), patterns such as those shown in FIGS. 1A to 1C are projected onto the first resist pattern 11 by exposing the semiconductor substrate 3 to a g-line or an i-line from the Hg lamp through a mask (omitted from FIG. 8B).

The material described for the first embodiment is effectively used as the first resist 11 in the second embodiment. The detailed and repeated explanation of the material will be omitted here for brevity. Specifically, it is desirable for the first resist 11 to include a low-molecular-weight carboxylic acids.

The substrate is subjected to a post-exposure baking (at a temperature of 10 to 130° C.), as required, thus improving the resolution of the photoresist. The resist is then developed, using an about 2.0 wt. % diluted aqueous solution of TMAH (tetra methyl ammonium hydroxide). FIG. 8B shows first resist patterns 11a thus formed.

There may be a case where the substrate is subjected to a post-development baking treatment, as required. Since this heat treatment affects a subsequent mixing reaction, the temperature of the heat treatment must be set to a suitable temperature. Aside from use of the acid-containing first resist 11, the resist patterns are formed in the same manner as those formed through existing processes.

After the resist patterns have been formed in a manner as shown in FIG. 8B, the semiconductor substrate (or wafer) 3 is coated with a second resist 12 which contains a crosslinkable compound which is capable of causing a crosslinking reaction in the presence of an acid and is incapable of dissolving the first resist 11 in a manner as show in FIG. 8C.

Material and a solvent which are the same as those described for the first embodiment are available and used for the second resist 12 in the second embodiment. Detailed and repeated descriptions of them will be omitted here for brevity.

After having been coated with the second resist 12, the substrate is subjected to a baking treatment, as required. Since this heat treatment affects a subsequent mixing reaction, it is desirable to set the temperature of the heat treatment to a suitable temperature.

As shown in FIG. 8D, the semiconductor substrate 3 is subjected to a heat treatment (at a temperature of 60 to 130° C.) to thereby cause the acidic substance included in small amounts in the first resist patterns 11a to diffuse an acid. This in turn causes a crosslinking reaction along the boundary surface between the second resist 12 and the first resist patterns 11a. As a result of the crosslinking reaction, a crosslinked layer 14 is formed in the second resist 12 so as to cover the first resist patterns 11a.

As shown in FIG. 8F, the substrate is cleansed with a mixed solution comprising water incapable of dissolving the first resist patterns 11a and a water-soluble organic solvent (e.g., propanol). Subsequently, the substrate is rinsed with water, thereby removing non-crosslinked portions of the second. resist 12. Through the foregoing processes, it is possible to produce a resist pattern having holes of smaller inner diameter, resist patterns spaced at smaller pitches apart from each other, or a resist pattern which comprises isolated islands having an increased area.

As mentioned previously, the first resist 11 according to the second embodiment is controlled in such a way that the first resist 11 itself contains an acid, and the acid is diffused by a heat treatment process to thereby cause a crosslinking reaction. Therefore, there is no need to produce an acid by exposing a substrate to light. Low-molecular-weight carboxylic acids are desirable for use as an acid to be included in the first resist 11. However, the acid is not limited to a specific type of acid, so long as it is capable of being mixed with the first resist 11.

As in the case of the first embodiment, the second resist patterns 12a are formed on various types of semiconductor substrates, and minute isolated spaces or minute holes can be formed in the semiconductor substrate, using the thus-formed resist patterns as masks.

Third Embodiment

FIGS. 9A to 9G are flowcharts for explaining a method of forming minutely isolated resist patterns according to a third embodiment of patterns according to a third embodiment and a method of manufacturing a semiconductor device using this pattern forming method, will be described by reference to FIGS. 1A–1c through FIGS. 9A–9G.

Figure 9:
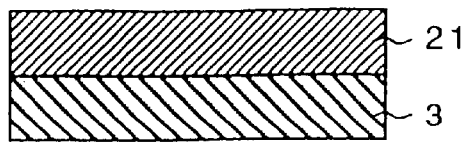
FIGS. 9A to 9G are flowcharts for explaining processes of manufacture of resist patterns under still another method according to a third embodiment of the present invention.
Figure 9:
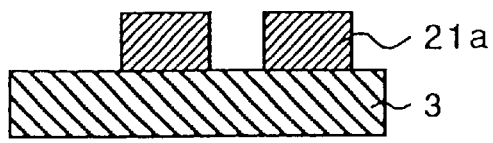
Figure 9:
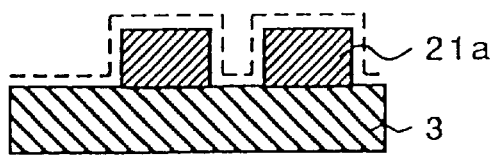
Figure 9:
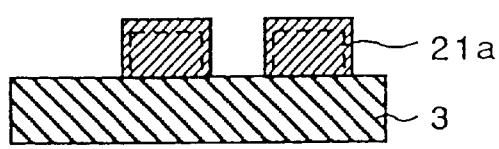
Figure 9:
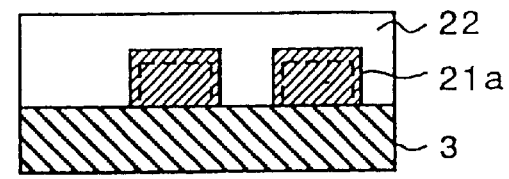
Figure 9:
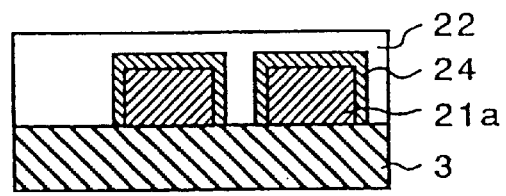
Figure 9:
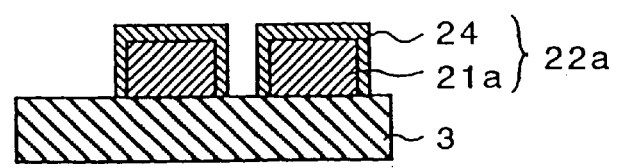

As shown in FIG. 9A, the semiconductor substrate 3 is coated with a first resist 21. After the first resist pattern 21 has been subjected to a pre-baking treatment (a heat treatment at a temperature of 70 to 100° C. for about one minute), patterns such as those shown in FIGS. 1A to 1C are projected onto the first resist pattern 21 by exposing the semiconductor substrate 3 to, e.g., a g-line or an i-line from the Hg lamp, according to the sensitizing wavelength of the first resist 21 through a mask (omitted from FIG. 9B). The substrate is subjected to post-exposure baking (at a temperature of 10 to 130° C.), as required, thus improving the resolution of the photoresist. The resist is then developed, using an about 2.0 wt. % diluted aqueous solution of TMAH (tetra methyl ammonium hydroxide). FIG. 9B shows first resist patterns 21a thus formed.

There may be a case where the substrate is subjected to a post-development baking treatment, as required. Since this heat treatment affects a subsequent mixing reaction, the temperature of the heat treatment must be set to a suitable temperature. Aside from use of the acid-containing first resist 11, the resist patterns are formed in the same manner as those formed through existing processes.

After the resist patterns have been formed in a manner as shown in FIG. 9B, the semiconductor substrate (or wafer) 3 is immersed in an acidic solution in a manner as show in FIG. 9C. The substrate may be immersed through use of a common paddle development method or by vaporization (or spraying) of an acidic solution. In such a case, either an organic or inorganic acidic solution may be used as an acidic solution. More specifically, for example, the acidic solution may be preferably a solution containing a low concentration of acetic acid. In the foregoing process, an area in the vicinity of an exterior surface of the first resist patterns 21a is soaked with an acid, thus forming a thin acid-containing layer along the exterior surface of the first resist patterns 21a. The substrate is rinsed with pure water, as required.

As shown in FIG. 9E, the semiconductor substrate 3 is coated with a second resist 22—which includes a crosslinkable compound capable of causing a crosslinking reaction in the presence of an acid and which is dissolved in a solvent incapable of dissolving the first resist patterns 21a—so as to cover the first resist patterns 21a.

Material and a solvent which are the same as those described for the first embodiment are available and used for the second resist 22 in the third embodiment. Detailed and repeated descriptions of them will be omitted here for brevity. After having been coated with the second resist 22, the substrate is subjected to a baking treatment, as required. Since this heat treatment affects a subsequent mixing reaction, it is desirable to set the temperature of the heat treatment to a suitable temperature.

As shown in FIG. 9F, the semiconductor substrate 3 is subjected to a heat treatment (at a temperature of 60 to 130° C.) to thereby cause the first resist patterns 21a to diffuse an acid. This in turn causes a crosslinking reaction along the boundary surface between the second resist 22 and the first resist patterns 21a. As a result of the crosslinking reaction, a crosslinked layer 24 is formed in the second resist 22 so as to cover the first resist patterns 21a.

As shown in FIG. 9G, the substrate is cleansed with a mixed solution comprising water incapable of dissolving the first resist patterns 21a and a water-soluble organic solvent (e.g., propanol). Subsequently, the substrate is rinsed with water and dried, thereby removing non-crosslinked portions of the second resist 22. Through the foregoing processes, it is possible to produce a resist pattern having holes of smaller inner diameter, resist patterns spaced at smaller pitches apart from one another, or a resist pattern which comprises As mentioned previously, according to the third embodiment, the first resist patterns 21a are subjected to a surface treatment through use of an acidic liquid before the second resist 22 is grown on the first resist patterns 21a. The substrate is then subjected to a heat treatment to thereby diffuse an acid and to cause a crosslinking action. Therefore, there is no need to produce an acid in the first resist patterns by exposing a substrate to light.

As in the case of the first and second embodiments, the second resist patterns 22a are formed on various types of semiconductor substrates, and minute isolated spaces or minute holes can be formed in the semiconductor substrate while the thus-formed resist patterns are used as masks, thus forming a semiconductor device.

EXAMPLES

Next, examples pertinent to the respective embodiments mentioned previously will be described. Since one example may be relevant to one or more embodiments, examples will be collectively described for each of the elements. Specifically, material used as the first resist, material used as the second resist, and formation of minute resist patterns.

First, examples 1 through 5 will be described with regard to material used as the first resist.

Example 1

Resist patterns were formed, using an i-line resist (manufactured by Mitsubishi Chemical Industries Ltd.)—which is formed from novolac resin and naphthoquinonediazide and which is dissolved in ethyl lactate and propylene glycol monoethyl acetate—as the first resist.

First, the foregoing resist was dropped on a silicon wafer, and the silicon wafer was then spin-coated with the resist. The wafer was subjected to a pre-soaking treatment at 85° C. for 70 seconds to thereby evaporate the solvent from the resist, thus forming the first resist to a thickness of about 1.0 μm.

Figure 10:
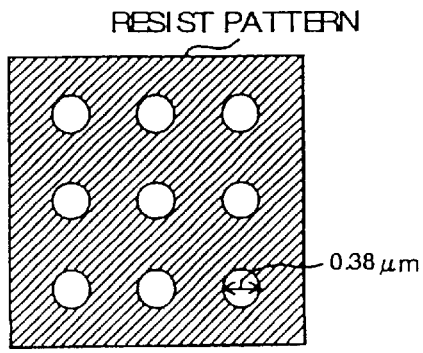
FIGS. 10A to 10C are plan views showing the first resist patterns formed in Example 1.
Figure 10:
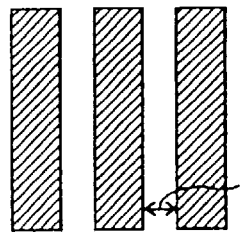
Figure 10:
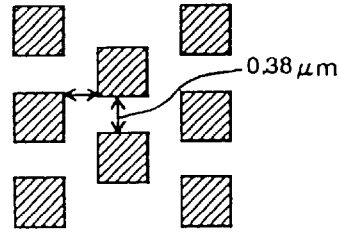

The thus-formed first resist was exposed to an i-line from an i-line reduced exposure system through a mask such as that shown in any one of FIGS. 1A to 1C. The substrate was then subjected to a PEB treatment at 120° C. for 70 seconds. Subsequently, the substrate was developed through use of an alkaline developer (NMD3 manufactured by Tokyo Oyokagaku Kogyo Ltd.), producing a resist pattern which has a hole size or an isolation pitch such as that shown in any one of FIGS. 10A to 10C.

Example 2

Resist patterns were formed, using an i-line resist (manufactured by Sumitomo Chemical Co., Ltd.)—which is formed from novolac resin and naphthoquinonediazide and which is dissolved in 2-heptanone—as the first resist.

First, the foregoing resist was dropped on a silicon wafer, and the silicon wafer was then spin-coated with the resist, thus growing the resist film to a thickness of about 0.8 μm. Next, the wafer was subjected to a pre-baking treatment at 85° C. for 70 seconds to thereby evaporate the solvent from the resist. The wafer was exposed to an i-line from an i-line reduced exposure system through a mask such as that shown in any one of FIGS. 1A to 1C.

Figure 11:
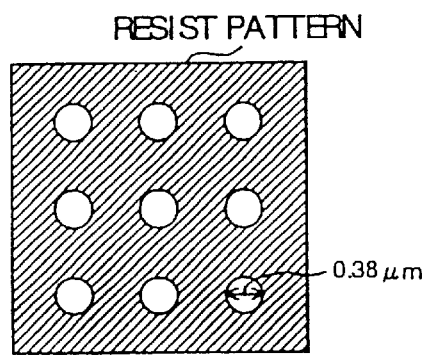
FIGS. 11A to 11C are plan views showing the first resist patterns formed in Example 2.
Figure 11:
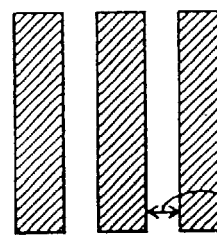
Figure 11:
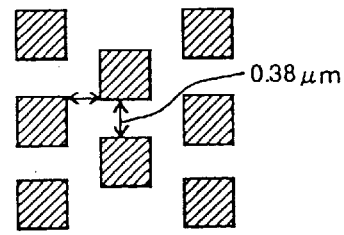

Subsequently, the substrate was subjected to a PEB treatment at 120° C. for 70 seconds and was developed through use of an alkaline developer (NMD3 manufactured by Tokyo Oyo-kagaku Kogyo Ltd.), producing a resist pattern which has a hole size or an isolation pitch such as that shown in any one of FIGS. 11A to 11C.

Example 3

Resist patterns were formed, using a chemically amplified (excimer resit (manufactured by Tokyo Oyo-kagaku Ltd.) as the first resist.

First, the foregoing resist was dropped on a silicon wafer, and the silicon wafer was then spin-coated with the resist, thus growing the resist film to a thickness of about 0.8 μm. Next, the wafer was subjected to a pre-baking treatment at 90° C. for 90 seconds to thereby evaporate the solvent from the resist. The wafer was exposed to a KrF excimer laser beam from a KrF excimer reduced exposure system through a mask such as that shown in any one of FIGS. 1A to 1C.

Figure 12:
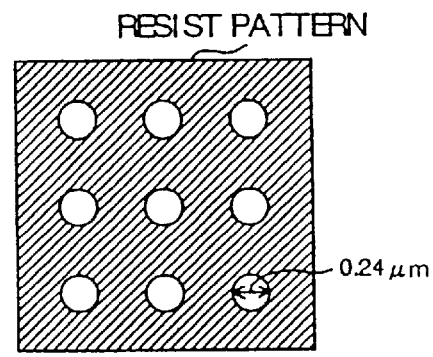
FIGS. 12A to 12C are plan views showing the first resist patterns formed in Example 3.
Figure 12:
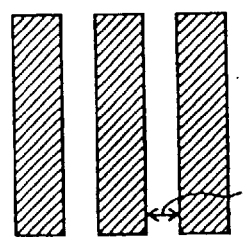
Figure 12:
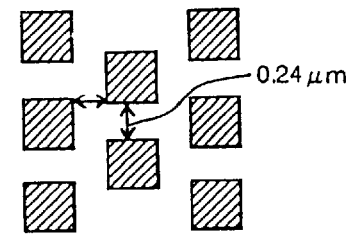

Subsequently, the substrate was subjected to a PEB treatment at 100° C. for 90 seconds and was developed through use of an alkaline developer (NMD-W manufactured by Tokyo Oyo-kagaku Kogyo Ltd.), producing a resist pattern such as that shown in any one of FIGS. 12A to 12C.

Example 4

Resist patterns were formed, using a chemically amplified resist [manufactured by Hisiden Kasei Co., Ltd., and refer to MELKER, J. Vac. Sci. Technol., B11 (6)2773, 1993]— which is formed from t-Boc polyhydroxystyrene and an acid generator—as the first resist.

First, the foregoing resist was dropped on a silicon wafer, and the silicon wafer was then spin-coated with the resist, thus growing the resist film to a thickness of about 0.52 μm. Next, the wafer was subjected to a pre-baking treatment at 120° C. for 180 seconds to thereby evaporate the solvent from the resist. The thus-formed resist was spin-coated with an antistatic agent (Espacer ESP-100 manufactured by Showa Denko K. K.) in a manner analogous to that mentioned previously, and the wafer was subjected to a baking treatment at 80° C. for 120 seconds.

Subsequently, patterns were drawn on the resist at a rate of 17.4 $\mu C/cm^2$ through use of an electron beam drawing system, and the wafer was subjected to a PEB treatment at 80° C. for 120 seconds. The antistatic film was removed through use of pure water, and the resist patterns were developed through use of an alkaline developer (NMD-W manufactured by Tokyo Oyo-kagaku Kogyo Ltd.), producing an electron beam resist pattern of about 0.2 μm such as that shown in any one of FIGS. 13A to 13C.

Examples 5 through 12 will be described with regard to material used as the-second resist.

Example 5

A 5 wt. % aqueous solution of polyvinyl acetal resin KW3 was formed as material for the second resist by adding 400 cc of water to 100 grams of a 20 wt. % polyvinyl acetal resin (Esflex KW3 manufactured by Sekisui Chemical Co., Ltd.) in a 1-liter messflask and by agitating the thus-formed mixture for 6 hours at room temperature. A 5 wt. % aqueous solution of polyvinyl acetal resin KW1 was formed in the same manner, except that it was formed from polyvinyl acetal resin (Esflex KW1 manufactured by Sekisui Chemical Co., Ltd.).

Example 6

Example 6 is different from Example 5 in that polyvinyl acetal resin is replaced with polyvinyl alcohol resin, oxazoline group-containing water-soluble resin (Epocross WS 500 manufactured by Nippon Shokubai Co., Ltd.), and styrene-maleic anhydride copolymers (SMA 1000, 1400H manufactured by ARCO Chemical Co., Ltd.). In short, a 5 wt. % aqueous solution of polyvinyl alcohol resin, a 5 wt. % aqueous solution of oxazoline-containing water-soluble resin, and a 5 wt. % aqueous solution of styrene-maleic anhydride copolymers were prepared as materials for the second resist in the same manner as those prepared in Example 5.

Example 7

An about 10 wt. % aqueous solution of methylolmelamine was formed as material for the second resist by mixing together 100 grams of methoxymethylol melamine (Cymel 370 of Mitsui Cynamide Co., Ltd), 780 cc of pure water, and 40 grams of IPA in a 1-liter messflask and by agitating the mixture for 6 hours at room temperature.

Example 8

An about 10 wt. % aqueous solution of ethyleneurea was formed as material for the second resist by adding 860 cc of pure water and 40 grams of IPA to 100 grams of (N-methoxymethyl) metoxy ethyleneurea in a 1-liter messflask and by agitating the thus-formed mixture for 6 hours at room temperature. Another aqueous solution was formed in the same manner, except that it was formed from (N-methoxymethyl) hydroxyethyleneurea and yet another aqueous solution was formed from N-methoxy methylurea.

Example 9

A mixed solution comprising water-soluble resin and a water-soluble crosslinking agent was formed as material for the second resist by mixing together 160 cc of the aqueous solution of polyvinyl acetal KW3 obtained in Example 5, 20 cc of the aqueous solution of methoxy methylol melamine obtained in Example 7, and 20 cc of pure water and by agitating the thus-prepared mixture for 6 hours at room temperature.

Example 10

Three types of mixed solutions comprising water-soluble resin and a water-soluble crosslinking agent were formed as materials for the second resist. Specifically, one type of mixed solution was formed by adding 20 cc of pure water to 20 cc of the aqueous solution of (N-methoxymethyl) metoxy ethyleneurea prepared in Example 8 and by agitating the thus-prepared mixture for 6 hours at room temperature. Another type of mixed solution was formed in the same manner, except that it was formed from 20 cc of the aqueous solution of (N-methoxymethyl) hydroxyethyleneurea prepared in Example 8. Yet another type of mixed solution was formed in the same manner, except that it was formed from 20 cc of the aqueous solution of N-methoxy methylurea prepared in Example 8.

Example 11

Three- types of aqueous solution of second resist were formed as materials for the second resist. Specifically, an aqueous solution of one type which has a concentration of about 11 wt. % of methoxy ethyleneurea used as a water-soluble crosslinking agent with respect to polyvinyl acetal resin was formed by mixing together 160 cc of the aqueous solution of polyvinyl acetal KW3 prepared in Example 5, 10 cc of the aqueous solution of methoxy ethyleneurea prepared in Example 8, and 20 cc of pure water for 6 hours at room temperature. An aqueous solution of another type having a concentration of about 20 wt. % of methoxy ethyleneurea was formed in the same manner, except that it was formed from 20 cc of the aqueous solution of methoxy ethyleneurea prepared in Example 8. An aqueous solution of still another type having a concentration of about 27 wt. % of methoxy ethyleneurea was formed in the same manner, except that it was formed from 30 cc of the aqueous solution of methoxy ethyleneurea prepared in Example 8.

Example 12

Three types of mixed solutions having different mixture ratios of polyvinyl acetal resin to polyvinyl alcohol resin were formed as materials for the second resist. Specifically, a mixed solution of one type was formed by mixing 100 cc of the 5 wt. % aqueous solution of polyvinyl acetal resin prepared in Example 5 with 0 cc of the 5 wt. % aqueous solution of polyvinyl alcohol resin prepared in Example 6 and by agitating the thus-prepared mixture for 6 hours at room temperature. A mixed solution of another type was formed in the same manner, except that it was formed from 35.3 cc of the 5 wt. % aqueous solution of polyvinyl alcohol resin prepared in example 6. A mixed solution of still another type was formed in the same manner, except that it was formed from 72.2 cc of the 5 wt. % aqueous solution of polyvinyl alcohol resin prepared in Example 6.

Examples 13 through 22 will now be described with regard to manufacture of minute resist patterns.

Example 13

The material for the second resist prepared in Example 12 was dropped on a silicon wafer having the first resist patterns formed thereon in Example 1, and the silicon wafer was then spin-coated with the second resist. Next, the wafer was subjected to a pre-baking treatment at 85° C. for 70 seconds, thus forming a second resist film.

Subsequently, the wafer was subjected to a mixing-and-baking (MB) treatment at 120° C. for 90 seconds, thereby accelerating a crosslinking reaction. A non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafer was then subjected to a post-baking treatment at 110° C., thus forming a second resist crosslinked layer over the first resist patterns. Finally, as shown in any one of FIGS. 14A to 14C, a second resist pattern was formed.

As shown in FIGS. 14A to 14C, crosslinked layers were formed while the mixture ratio of polyvinyl acetal resin to polyvinyl alcohol resin was changed. The size of each of the resist patterns (i.e., the diameter of a hole formed in the pattern) which had been prepared after formation of the crosslinked layer was measured while the proportion of water-soluble resins was changed.

As is obvious from a table shown in FIG. 15, it is found that the thickness of the crosslinked layer formed over the first resist patterns can be controlled by changing the ratio of polyvinyl acetal resin to polyvinyl alcohol resin.

Example 14

The aqueous solution of KW3 prepared in Example 5 was dropped as material for the second resist on a silicon wafer having the first resist patterns formed thereon in Example 2, and the silicon wafer was then spin-coated with the second resist. Next, the wafer was subjected to a pre-baking treatment at 85° C. for 70 seconds, thus forming a second resist film.

Subsequently, the entire surface of the wafer was exposed to an i-line from an i-line exposure system, and the thus-exposed wafer was further subjected to a mixing-and-baking (MB) treatment at 150° C. for 90 seconds, thereby accelerating a crosslinking reaction.

A non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafer was then subjected to a post-baking treatment at 110° C., thus forming a second resist crosslinked layer over the first resist patterns. Finally, as shown in FIG. 16, a second resist pattern was formed. A value of 0.36 μm shown in FIG. 16 represents the diameter of a hole formed before a crosslinked layer is formed.

With regard to the resist pattern shown in FIG. 16, the size of the resist pattern (or the size of a hole formed in the resist pattern) after formation of a crosslinked layer was measured when the entire surface of the wafer was exposed to light and when the entire surface was not exposed to light.

As shown in FIG. 17, the diameter of the hole formed in the first resist pattern before formation of the crosslinked layer is 0.36 μm. In a case where the entire surface of the wafer was exposed to light, the diameter of the hole was about 0.14 μm. In contrast, in a case where the entire surface was not exposed to light, the diameter of the hole was reduced to about 0.11 μm.

It is found that, in contrast with the case where the entire surface of the wafer is not exposed to light, the crosslinking reaction is accelerated by exposure of the entire surface of the wafer to light before the MB treatment, thus forming a thick crosslinked layer over the surface of the first resist.

Example 15

The mixed solution containing polyvinyl acetal resin and (20 wt. % of) ethyleneurea prepared in Example 11 was applied as a second resist to the silicon wafer having the first resist patterns formed thereon in Example 2.

The material used as the second resist was dropped on the wafer, and the wafer was spin-coated with the second resist. Next, the wafer was subjected to a mixing-and-baking (MB) treatment under three different conditions: that is, at 105° C. for 60 seconds; 116° C. for 60 seconds; and 125° C. for 60 seconds.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafer was then subjected to a post-baking treatment at 110° C., thus forming a second resist crosslinked layer over the first resist patterns. Finally, as shown in any one of FIGS. 18A to 18C, a second resist pattern (i.e., a holed pattern, line patterns, or isolated island patterns) was formed.

With regard to the resist patterns shown in FIGS. 18A to 18C, the size of an area to be measured in the resist pattern formed after formation of the crosslinked layer (i.e., the diameter of a hole shown in FIG. 8A, the pitch between the lines shown in FIG. 8B, and the pitch between the isolated island patterns shown in FIG. 8C) was measured while the temperature of the MB treatment was changed.

Figures 19, 20, 21:
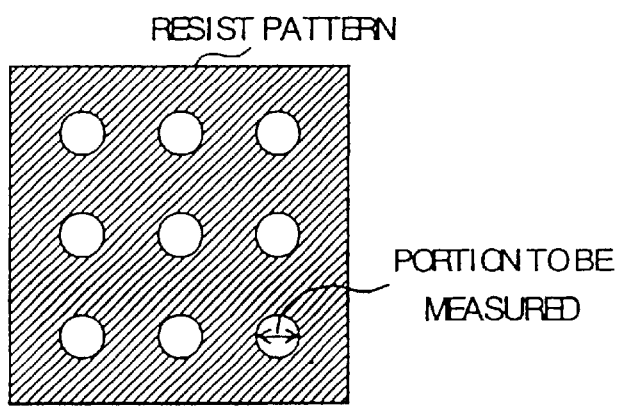
FIGS. 19 is a table showing the results of measurement of the resist patterns formed in Example 15.
FIG. 20 is a plan view showing the second resist pattern formed in Example 16.
FIG. 21 is a table showing the results of measurement of the resist patterns formed in Example 16.

As is obvious from a table shown in FIG. 19, in the case of the resist patterns after formation of the crosslinked layer, the inner diameter of the hole—which had a diameter of 0.36 μm and was formed in Example 2—and the pitch (of 0.40 μm) between the line patterns and between the isolated island patterns were reduced. The extent to which the diameter and the pitch are reduced increases with an increase in the temperature of the MB treatment.

From the foregoing descriptions, it is found that the crosslinking reaction can be accurately controlled by control of the temperature of the MB treatment.

Example 16

Three types of mixed aqueous solutions were applied, as a second resist, onto silicon wafers, each having the first resist patterns formed thereon in Example 2. Specifically, the mixed solutions were formed from the aqueous solution of polyvinyl acetal prepared in Example 5, the aqueous solution of polyvinyl acetal resin prepared in Example 10, and methoxy ethyleneurea serving as a water-soluble crosslinking agent while a concentration of methoxy ethyleneurea was changed.

These three types of materials was dropped on wafers, and the wafers were spin-coated with the second resist. Next, the wafers were subjected to a mixing-and-baking (MB) treatment at 115° C. for 60 seconds, thus causing a crosslinking reaction.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafers were then subjected to a post-baking treatment at 110° C., thus forming a second resist crosslinked layer over the first resist patterns. Finally, as shown in FIG. 20, a second resist pattern was formed.

With regard to the resist pattern shown in FIG. 20, the size of the resist pattern (or the diameter of a hole) formed after formation of the crosslinked layer was measured while the concentration of the water-soluble crosslinking agent was changed.

As is obvious from a table shown in FIG. 21, the inner diameter of the hole—which had a diameter of 0.36 μm and was formed in Example 2—was reduced. The extent to which the diameter is reduced increases with an increase in the mixture ratio of the. water-soluble crosslinking agent.

From the foregoing descriptions, it is found that the crosslinking reaction can be accurately controlled by control of the mixture ratio of the water-soluble material.

Example 17

Four types of aqueous solutions were applied as a second resist onto the silicon wafer having the first resist patterns formed thereon in Example 3: that is, the aqueous solution of polyvinyl acetal prepared in Example 5; a mixed solution which is composed of the aqueous solution of polyvinyl acetal resin and (N-methoxymethyl) dimethoxymethyleneurea, serving as a water-soluble crosslinking agent, and which was prepared in Example 10; a mixed solution composed of polyvinyl acetal resin and (N-methoxymethyl)methoxyhydroxyethyleneurea prepared in Example 10; and a mixed solution composed of polyvinyl acetal resin and N-methoxymethylurea prepared in Example 10. These four types of materials used as the second resist were dropped on wafers, and the wafers were spin-coated with the second resists. Next, the wafers were subjected to a mixing-and-baking (MB) treatment at 105° C. for 60 seconds, thus causing a crosslinking reaction.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafer was then subjected to a post-baking treatment at 110° C., thus forming a second resist crosslinked layer over the first resist patterns. There was formed a second resist pattern analogous to that shown in FIG. 20.

With regard to the resist pattern shown in FIG. 20, the size of the resist pattern (or the diameter of a hole) formed after formation of the crosslinked layer was measured while the type of the water-soluble crosslinking agent was changed.

As is obvious from a table shown in FIG. 22, the inner diameter of the hole—which had a diameter of 0.24 μm and was formed in Example 3—was reduced. It is found that the extent of reduction in the inner diameter varies with the type of the water-soluble crosslinking agent.

From the foregoing descriptions, it is found that the crosslinking reaction can be accurately controlled by control of the mixture ratio of the water-soluble material.

Example 18

A mixed aqueous solution was applied onto the silicon wafer having the first resist patterns formed thereon in Example 3, the solution comprising an aqueous solution of polyvinyl acetal resin and N-methoxymethyl-hydroxymethoxyethyleneurea serving as a water-soluble crosslinking agent.

The second resist was dropped on a wafer, and the wafer was spin-coated with the second resist. Next, the wafer was subjected to a mixing-and-baking (MB) treatment at given temperature for 60 seconds, thus causing a crosslinking reaction.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafer was then subjected to a post-baking treatment at 110° C., thus forming a second resist crosslinked layer over the first resist patterns. There was formed a second resist pattern analogous to that shown in FIG. 20.

With regard to the resist pattern shown in FIG. 20, the size of the resist pattern (or the diameter of a hole) formed after formation of the crosslinked layer was measured while the amount of water-soluble crosslinking agent and the temperature of the mixing-and-baking (MB) treatment were changed.

As is obvious from a table shown in FIG. 23, the inner diameter of the hole—which had a diameter of 0.24 µm and was formed in Example 3—was reduced. It is found that the extent of reduction in the inner diameter varies with the type of the amount of water-soluble crosslinking agent and the temperature of the MB treatment.

From the foregoing descriptions, it is found that the size of a resist pattern can be controlled by utilization of a crosslinking reaction even when there is used a chemically amplified resist which produces an acid upon exposure.

Example 19

A solution was applied, as material for the second resist, onto the silicon wafer having the first resist patterns formed thereon in Example 3, the solution comprising: the aqueous solution of polyvinyl alcohol solution prepared in Example 6, and a mixed solution which was composed of (N-methoxymethyl)dimethoxyethyleneurea and polyvinyl alcohol and was controlled so as to contain 10 wt. % of urea.

The second resist was dropped on a wafer, and the wafer was spin-coated with the second resist. Next, the wafer was subjected to a mixing-and-baking (MB) treatment at three different temperatures of 95, 105, and 115° C. for 60 seconds, thus causing a crosslinking reaction.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafer was then subjected to a post-baking treatment at 110° C., thus forming a second resist crosslinked layer over the first resist patterns. There was formed a second resist pattern analogous to that shown in FIG. 20.

With regard to the resist pattern shown in FIG. 20, the size of the resist pattern (or the diameter of a hole) formed after formation of the crosslinked layer was measured while the temperature of the MB treatment was changed with regard to where the second resist was provided with a crosslinking agent and to where the second resist was not provided with the crosslinking agent.

As is obvious from a table shown in FIG. 24, the inner diameter of the hole—which had a diameter of 0.24 µm and was formed in Example 3—was reduced. It is found that a crosslinking reaction is further accelerated by addition of a crosslinking agent, that the extent of reduction in the diameter can be readily controlled by means of the temperature of the heat treatment, and that the extent to which the amount of reduction in the diameter of the hole is controlled is increased.

Example 20

The aqueous solution of polyvinyl alcohol prepared in Example 6 and the mixed solution containing polyvinyl alcohol and (10 wt. % of) ethyleneurea prepared in Example 19 were used as second resists respectively on the 8-inch silicon wafers having the resist patterns formed thereon in Example 3.

The second resist was dropped on the wafer, and the wafer was spin-coated with the second resist. Next, the wafer was subjected to a mixing-and-baking (MB) treatment at 115° C. for 60 seconds, thus causing a crosslinking reaction.

Subsequently, a non-crosslinked layer was dissolved and removed from the wafer in four ways: that is, by cleansing the wafer solely with pure water for 60 seconds; by cleansing the wafer solely with pure water for 180 seconds; by cleansing the wafer solely with pure water for 300 seconds; and by cleaning the wafer with an aqueous solution of isopropyl alcohol for 10 seconds in a stationary manner and by rinsing the wafer with pure water for 50 seconds.

The thus-formed resist patterns were checked as to whether or not they have pattern defects or foreign matter, using a KLA pattern defect inspection system. As is evident from the table of FIG. 25, a plurality of speck-like defects or non-dissolved residues were found in the surface of the 8-inch wafer in the case where the wafer was cleansed solely with water. In contrast, in the case where the wafer was cleansed with the aqueous solution of isopropyl alcohol and by rinsing the wafer with pure water, no speck-like defects or undissolved residues were found at all. Still further, in the case where the water-soluble crosslinkable agent was added to the resist, it is found that there is an improvement in the solubility of a non-crosslinked portion, which in turn reduces specks or residues remaining after cleansing of the wafer.

It is found that a two-step cleansing process: that is, cleansing of the wafer with a solution having high solubility followed by rinsing of the wafer with water, is effective in preventing undissolved residues.

Example 21

Three types of mixed aqueous solutions were applied, as a second resist, onto silicon wafers, each having the first resist patterns formed thereon in Example 4. Specifically, one type of mixed aqueous solution was formed from the aqueous solution of polyvinyl acetal resin KW3 in Example 5; another type of mixed aqueous solution was formed from the aqueous solution of polyvinyl acetal resin KW3 and methoxyethyleneurea serving as a water-soluble crosslinking agent in Example 10; and still another type of mixed aqueous solution was formed from polyvinyl alcohol and (10 wt. % of) methoxyethyleneurea in Example 19.

These three types of materials was dropped on wafers, and the wafers were spin-coated with the second resist. Next, the wafers were subjected to a mixing-and-baking (MB) treatment at 85° C. for 70 seconds, thus forming a second resist film.

The wafer was subjected to a mixing-and-baking (MB) treatment at two different temperatures of 105 and 115° C. for 60 seconds, causing a crosslinking reaction.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafers were then subjected to a post-baking treatment at 110° C., thus forming a second resist crosslinked layer over the first resist patterns. Finally, as shown in FIG. 20, a second resist pattern was formed.

With regard to the resist pattern shown in FIG. 20, the size of the resist pattern (or the diameter of a hole) formed after formation of the crosslinked layer was measured while the type of crosslinking agent was changed.

As is evident from a table in FIG. 26, it is acknowledged that the size of the resist pattern which had a size of about 0.2 µm and was formed in Example 4 was reduced. The amount of reduction in size varies with the type of water-soluble resin.

Therefore, it is found that the present invention allows control of the size of a resist pattern by utilization of a crosslinking reaction even in a case where a chemically amplified EB resist composed of t-boc polyhydroxystyrene and an acid generator is used.

Example 22

The first resist patterns formed in previous Examples were selectively exposed to an electron beam at a does of 50 µC/cm².

The thus-exposed resist patterns were coated with a second resist, i.e., a mixed aqueous solution formed from an aqueous solution of polyvinyl acetal resin and (10 wt. % of) methoxyethyleneurea serving as a water-soluble crosslinking agent in Example 11. The second resist was dropped onto the wafer, and the wafer was coated with the second resist by spin-coating. The thus-coated wafer was further subjected to a mixing-and-baking (MB) treatment at 110° C. for 60 seconds, thus causing a crosslinking reaction.

Subsequently, a non-crosslinked layer was dissolved and removed from the wafer by the steps of: cleansing the wafer with an aqueous solution of isopropyl alcohol for 10 seconds in a stationary manner; further rinsing the wafer with water for 60 seconds; and drying the wafer while it was being spun.

The wafers were then subjected to a post-baking treatment at 110° C., thus forming a second resist crosslinked layer over the first resist patterns. Finally, as shown in FIG. 20, a second resist pattern was formed.

With regard to the resist pattern shown in FIG. 20, the size of the resist pattern (or the diameter of a hole) formed after formation of the crosslinked layer was measured with regard to exposed areas and unexposed areas of the resist patterns.

As is evident from a table in FIG. 27, a reduction in the size of the resist pattern—which had a size of about 0.36 µm and was formed in Example 2—was found in the unexposed areas. In contrast, no crosslinking reaction occurred in the selectively-exposed areas, and no reduction in the size of the hole was found in the exposed areas.

Therefore, it is obvious that if the resist patterns are selectively exposed to an electron beam, no crosslinking reaction occurs in the exposed areas, and therefore the size of a resist pattern can be selectively controlled.

As has been described above, the present invention provides material for use in forming minutely isolated patterns which enables formation of isolated resist patterns or holed patterns smaller than the limit of wavelength of light, as well as providing a method of forming minute patterns from this material. According to the present invention, there are produced considerably clean minute patterns free from speck-like defects or undissolved residues. As a result, the pitch between lines of a resist patterns can be reduced to a much greater extent when compared with the existing resist patterns.

Minutely isolated spaces or holes can be formed in a semiconductor substrate through use of the thus-formed minutely isolated resist patterns as masks.

According to the foregoing manufacturing method, it is possible to manufacture a semiconductor device having minutely isolated spaces or holes.

Obviously many modifications and variations of the present invention are possible in the light of the above teachings. It is therefore to be understood that within the scope of the appended claims the invention may by practiced otherwise than as specifically described.

What is claimed is:

1. A method of manufacturing a semiconductor device comprising the steps of:

forming a first resist pattern capable of supplying an acid on a semiconductor substrate by growing a first resist and by forming a pattern on the first resist;

forming a second resist on the first resist pattern, the second resist being incapable of dissolving the first resist pattern and being capable of causing a crosslinking reaction in the presence of an acid;

forming a crosslinked portion along the boundary surface between the first resist pattern and the second resist adjoining the first resist pattern by means of the acid supplied from the first resist pattern;

forming a second resist pattern through multi-step processing, in which non-crosslinked portions of the second resist are developed through use of a solution in which the noncrosslinked portions have a high solubility in the solution and the solution is incapable of dissolving the first resist pattern, but capable of dissolving the second resist and then rinsing the substrate with water; and etching the semiconductor substrate, using the second resist pattern as a mask.

2. The semiconductor device manufacturing method as defined in claim 1, wherein the solution is a mixed solution formed by mixing water with alcohol or a water-soluble organic solvent to such an extent as not to dissolve the first resist.

3. The semiconductor device manufacturing method as defined in claim 1, wherein the solution contains a surfactant.

4. The semiconductor device manufacturing method as defined in claim 1, wherein the first resist produces an acid upon exposure to light or when subjected to a heat treatment.

5. The semiconductor device manufacturing method as defined in claim 1, wherein the first resist diffuses an acid included therein when subjected to a heat treatment to cause crosslinking reaction at an interface with said second resist.

6. The semicondutor device manufacturing method as defined in claim 1, wherein the first resist produces an acid when exposed to light and when subjected to a heat treatment.

7. The semiconductor device manufacturing method as defined in claim 1, wherein the first resist contains an acid.

8. The semiconductor device manufacturing method as defined in claim 1, wherein the surface of the first resist pattern is processed through use of an acidic liquid or an acidic gas.

9. The semiconductor device manufacturing method as defined in claim 1, wherein the crosslinked film is formed along the surface of a predetermined area of the first resist pattern by selectively exposing the predetermined area to light and by heating the thus-exposed area.

10. The semiconductor device manufacturing method as defined in claim 1, wherein the crosslinked film is formed along the surface of a predetermined area of the first resist pattern by selectively exposing the predetermined area to an electron beam.

11. The semiconductor device manufacturing method as defined in claim 1, wherein the first resist is formed from a mixture composed of novolac resin and a naphthoquinonediazide-based photosensitive agent.

12. The semiconductor device manufacturing method as defined in claim 1, wherein the first resist is a chemically amplified resist which uses a mechanism of producing an acid when the resist is exposed to UV-rays, an electron beam, or X-rays.

13. The semiconductor device manufacturing method as defined in claim 1, wherein the second resist is selected from a group consisting of water-soluble resin, water-soluble resin which causes a crosslinking reaction in the presence of an acid, a water-soluble crosslinking agent, and mixtures thereof.

14. The semiconductor device manufacturing method as defined in claim 13, wherein the water-soluble resin is selected from the group consisting of a polyacrylic acid, polyvinyl acetal, polyvinylpyrrolidone, polyvinyl alcohol, polyethyleneimine, sytrene-maleic anhydride copolymer, polyvinylamine, polyallylamine, oxazoline group-containing water-soluble resins, water-soluble urethane, water-soluble phenol, water-soluble epoxy, water-soluble melamine resins, water-soluble urea resins, alkyd resins, sulfonamide, one type of salt thereof, and a mixture of two or more types of thereof.

15. The semiconductor device manufacturing method as defined in claim 13, wherein the water-soluble crosslinking agent is one type of material or two or more types of materials selected from the group consisting of melamine-based crosslinking agents such as melamine derivatives or methylolmelamine derivatives; urea-based crosslinking agents such as urea derivatives, methylol urea derivatives, ethylene urea carboxylates, or methylol-ethylene-urea derivatives; and amino-based crosslinking agents such as benzoguanamine, glycoluril, isocyanates.

16. The semiconductor device manufacturing method as defined in claim 13, wherein the second resist is polyvinyl acetal resin, and the amount of the second resist reacting with the first resist pattern is controlled by controlling the extent of acetalization of the polyvinyl acetal resin.

17. The semiconductor device manufacturing method as defined in claim 13, wherein the second resist is a mixture of a water-soluble resin and a water-soluble crosslinking agent, and the amount of the second resist reacting with the first resist patterns is controlled by controlling the amount of the proportion of the water-soluble crosslinking agent.

18. The semiconductor device manufacturing method as defined in claim 13, wherein a solvent for the second resist is water or a mixed solvent containing water, alcohol, and N-methylpirrolidone.

19. A method of manufacturing a semiconductor device comprising the steps of:
    forming a first resist pattern capable of supplying an acid on a semiconductor substrate by growing a first resist and by forming a pattern on the first resist;
    forming a second resist on the first resist pattern, the second resist being incapable of dissolving the first resist pattern and being capable of causing a crosslinking reaction in the presence of an acid;
    forming a crosslinked portion along the boundary surface between the first resist pattern and the second resist adjoining the first resist pattern by means of the acid supplied from the first resist pattern;
    forming a second resist pattern through multi-step processing, in which non-crosslinked portions of the second resist are developed through use of a solution in which the non-crosslinked portions have a high solubility in the solution and the solution is incapable of dissolving the first resist pattern, but capable of dissolving the second resist and then rinsing the substrate to prevent undissolved residues; and
    etching the semiconductor substrate, using the second resist pattern as a mask.

20. The semiconductor device manufacturing method as defined in claim 19, wherein the rinsing step is rinsing the substrate with water.

* * * * *